(12) United States Patent
Shin et al.

(10) Patent No.: US 11,257,708 B2
(45) Date of Patent: Feb. 22, 2022

(54) GAP-FILL LAYERS, METHODS OF FORMING THE SAME, AND SEMICONDUCTOR DEVICES MANUFACTURED BY THE METHODS OF FORMING THE SAME

(71) Applicant: Samsung Electronics Co., Ltd., Suwon-si (KR)

(72) Inventors: Miso Shin, Seoul (KR); Chungki Min, Hwaseong-si (KR); Gihwan Kim, Suwon-si (KR); Sanghyeok Kim, Seoul (KR); Hyo-Jung Kim, Hwaseong-si (KR); Geunwon Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/377,516

(22) Filed: Apr. 8, 2019

(65) Prior Publication Data

US 2020/0075398 A1 Mar. 5, 2020

(30) Foreign Application Priority Data

Sep. 5, 2018 (KR) .......................... 10-2018-0106067

(51) Int. Cl.
*H01L 21/762* (2006.01)
*H01L 21/768* (2006.01)
(Continued)

(52) U.S. Cl.
CPC .. *H01L 21/76224* (2013.01); *H01L 21/31055* (2013.01); *H01L 21/31111* (2013.01);
(Continued)

(58) Field of Classification Search
CPC ......... H01L 21/76224; H01L 27/11582; H01L 21/762; H01L 21/76837; H01L 21/31055;
(Continued)

(56) References Cited

U.S. PATENT DOCUMENTS 6,406,975 B1 * 6/2002 Lim ...................... H01L 21/764
438/421
6,828,210 B2 * 12/2004 Kim ................... H01L 21/76232
438/424

(Continued)

FOREIGN PATENT DOCUMENTS

JP 4545679 B2 9/2010
KR 10-1998-0065679 10/1998
(Continued)

*Primary Examiner* — Shahed Ahmed
*Assistant Examiner* — Khatib A Rahman
(74) *Attorney, Agent, or Firm* — Harness, Dickey & Pierce, P.L.C.

(57) ABSTRACT

A device including a gap-fill layer may include an upper layer that on a lower layer that defines a trench that extends from a top surface of the upper layer and towards the lower layer, and the gap filling layer may be a multi-layered structure filling the trench. The gap-filling layer may include a first dielectric layer that fills a first portion of the trench and has a top surface proximate to the top surface of the upper layer, a second dielectric layer that fills a second portion of the trench and has a top surface proximate to the top surface of the upper layer and more recessed toward the lower layer than the top surface of the first dielectric layer, and a third dielectric layer that fills a remaining portion of the trench and covers the top surface of the second dielectric layer.

16 Claims, 28 Drawing Sheets

(51) Int. Cl.
  *H01L 21/3105* (2006.01)
  *H01L 27/11573* (2017.01)
  *H01L 21/324* (2006.01)
  *H01L 27/11582* (2017.01)
  *H01L 21/311* (2006.01)

(52) U.S. Cl.
  CPC ...... *H01L 21/324* (2013.01); *H01L 21/76837* (2013.01); *H01L 27/11573* (2013.01); *H01L 27/11582* (2013.01)

(58) Field of Classification Search
  CPC ............. H01L 27/11573; H01L 21/324; H01L 21/31111; H01L 27/11575; H01L 27/11548; H01L 27/11556; H01L 27/11529; H01L 21/31144
  See application file for complete search history.

(56) References Cited

U.S. PATENT DOCUMENTS

| | | | |
|---|---|---|---|
| 7,052,971 B2* | 5/2006 | Nishiyama | H01L 21/76837 438/437 |
| 7,319,062 B2* | 1/2008 | Hong | H01L 21/76224 257/E21.546 |
| 7,375,029 B2 | 5/2008 | Poelzl | |
| 8,927,388 B2* | 1/2015 | Chen | H01L 21/76224 438/424 |
| 9,034,707 B2 | 5/2015 | Lee | |
| 9,202,870 B2 | 12/2015 | Lee et al. | |
| 9,257,274 B2* | 2/2016 | Kang | C23C 16/56 |
| 9,659,959 B2 | 5/2017 | Lee et al. | |
| 10,014,207 B2* | 7/2018 | Tsai | H01L 21/76826 |
| 10,483,154 B1* | 11/2019 | Smith | H01L 21/76283 |
| 2003/0030121 A1* | 2/2003 | Heo | H01L 21/76229 257/499 |
| 2006/0051926 A1* | 3/2006 | Jeong | H01L 27/11521 438/296 |
| 2007/0077723 A1* | 4/2007 | Ahn | H01L 21/76224 438/424 |
| 2009/0068818 A1* | 3/2009 | Kim | H01L 21/76224 438/435 |
| 2012/0034757 A1* | 2/2012 | Choi | H01L 21/76224 438/437 |
| 2012/0068242 A1* | 3/2012 | Shin | H01L 27/11578 257/315 |
| 2013/0207177 A1* | 8/2013 | Kim | H01L 21/76224 257/324 |
| 2014/0124881 A1* | 5/2014 | Kwon | H01L 27/228 257/421 |
| 2015/0295005 A1* | 10/2015 | Tseng | H01L 27/14632 257/446 |
| 2017/0110375 A1* | 4/2017 | Bao | H01L 21/823842 |
| 2017/0243884 A1 | 8/2017 | Nakaki et al. | |
| 2017/0263618 A1 | 9/2017 | Shimojo | |
| 2017/0352678 A1 | 12/2017 | Lu et al. | |

FOREIGN PATENT DOCUMENTS

| | | |
|---|---|---|
| KR | 10-2005-0063338 A | 6/2005 |
| KR | 10-2009-0053036 A | 5/2009 |

* cited by examiner

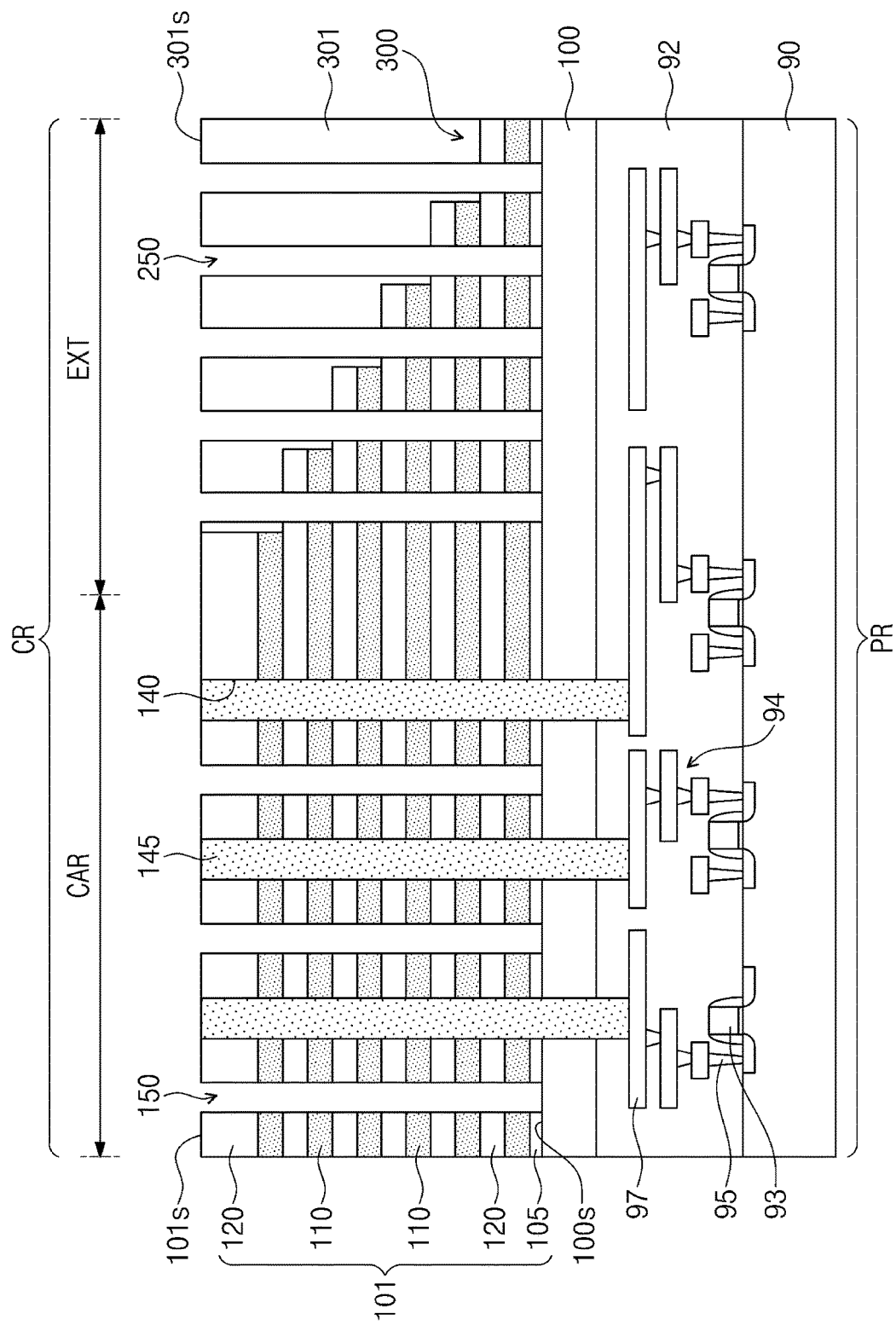

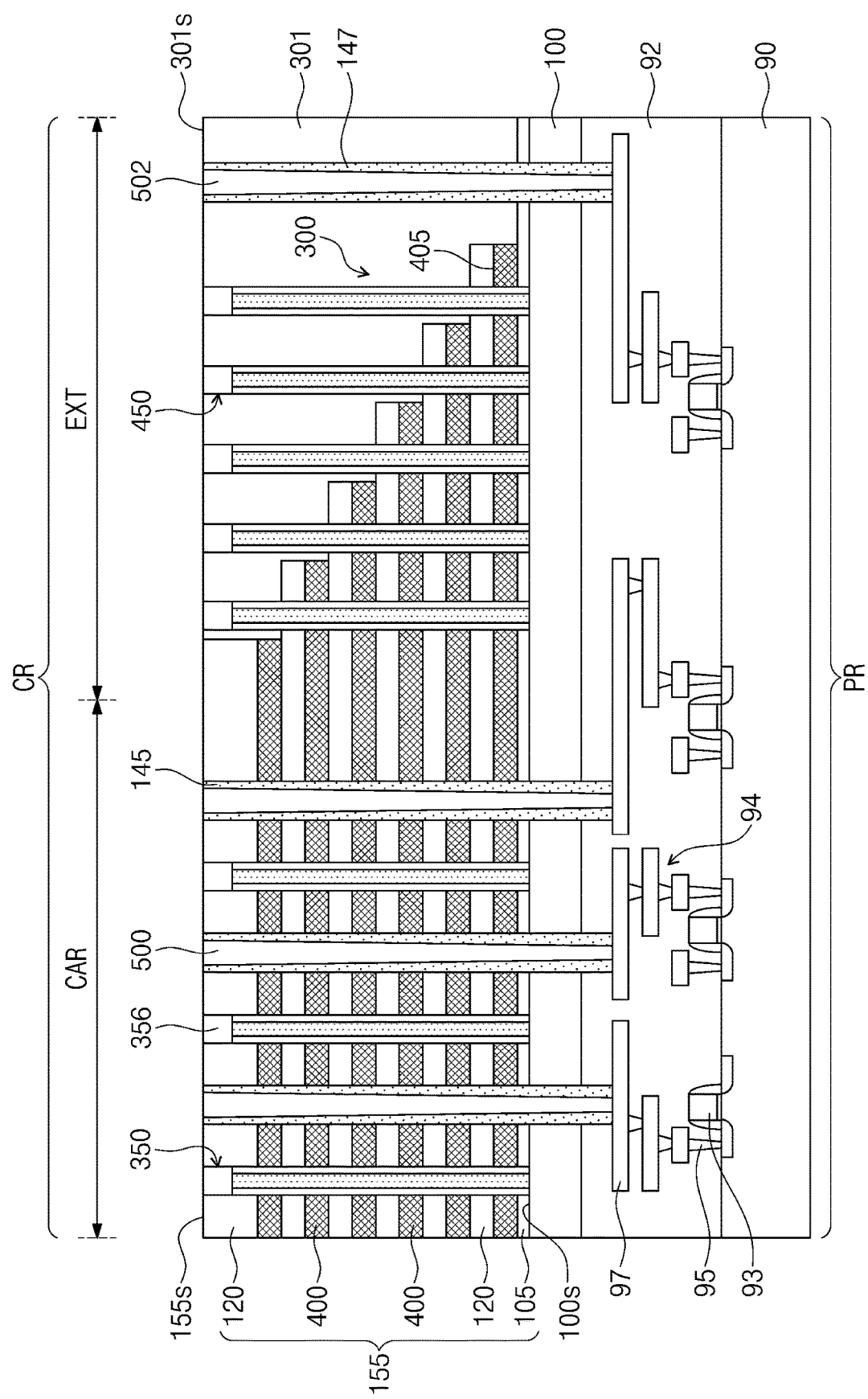

GAP-FILL LAYERS, METHODS OF FORMING THE SAME, AND SEMICONDUCTOR DEVICES MANUFACTURED BY THE METHODS OF FORMING THE SAME

CROSS-REFERENCE TO RELATED APPLICATION

This U.S. nonprovisional application claims priority under 35 U.S.C § 119 to Korean Patent Application No. 10-2018-0106067 filed on Sep. 5, 2018 in the Korean Intellectual Property Office, the entire contents of which are hereby incorporated by reference.

BACKGROUND

The present inventive concepts relate to semiconductors, and more particularly, to gap-fill layers, methods of forming the same, and/or semiconductor devices manufactured by the methods of forming the same.

Different kinds of dielectric layers may be used to effectively fill a trench having relatively great width and depth, but cracks may occur when annealing and planarization processes are performed. The cracks may lead to defects in subsequent patterning processes and may have a negative effect on operation of semiconductor devices.

SUMMARY

Some example embodiments of the present inventive concepts provide gap-fill layers configured to prevent the occurrence of cracks when a trench is filled with different kinds of dielectric layers, methods of forming the same, and semiconductor devices manufactured by the methods of forming the same.

According to some example embodiments of the present inventive concepts, a device may include a lower layer, an upper layer on the lower layer that defines a trench extending from a top surface of the upper layer towards the lower layer, and a gap-fill layer filling the trench. The gap-fill layer may have a multi-layered structure. The gap-fill layer may include a first dielectric layer that fills a first portion of the trench, a second dielectric layer that fills a second portion of the trench, and a third dielectric layer that fills a remaining portion of the trench. The first dielectric layer may have a top surface that is proximate to the top surface of the upper layer. The second dielectric layer may have a top surface that is proximate to the top surface of the upper layer. The top surface of the second dielectric layer may be more recessed toward the lower layer than the top surface of the first dielectric layer. The third dielectric layer may cover the top surface of the second dielectric layer.

According to some example embodiments of the present inventive concepts, a method of forming a gap-fill layer may include forming an upper layer on a lower layer, forming a trench that extends through the upper layer from a top surface of the upper layer towards the lower layer, forming a first dielectric layer that extends along an inner sidewall surface of the trench, forming a second dielectric layer that fills a portion of the trench in which the first dielectric layer is formed, recessing a top surface of the first dielectric layer and a top surface of the second dielectric layer away from the top surface of the upper layer and toward the lower layer, the top surface of the second dielectric layer being recessed further toward the lower layer than the top surface of the first dielectric layer, and forming a third dielectric layer that covers the top surface of the first dielectric layer and the top surface of the second dielectric layer.

According to some example embodiments of the present inventive concepts, a semiconductor device may include a peripheral region including a peripheral circuit, the peripheral circuit including a plurality of transistors on a substrate, and a plurality of electrical lines electrically connected to the plurality of transistors. The semiconductor device may include a cell region on the peripheral region, the cell region including a semiconductor layer on the peripheral region, an electrode stack on the semiconductor layer and overlapping the peripheral circuit in a direction that is normal to a top surface of the semiconductor layer, the electrode stack having a stepwise structure, and a plurality of electrical vertical channels extending through the electrode stack in the direction that is normal to the top surface of the semiconductor layer, the plurality of electrical vertical channels electrically connected to the semiconductor layer. The semiconductor device may include a first gap-fill layer surrounding a first connection plug that sequentially extends through the cell region and the peripheral region and is coupled to one electrical line of the plurality of electrical lines, wherein the first gap-fill layer includes a first dielectric layer filling a first portion of a first trench, the first trench having a depth that extends through the cell region and the peripheral region and approaches the one electrical line, the first dielectric layer having a top surface that is proximate to a top surface of the electrode stack, a second dielectric layer filling a second portion of the first trench, the second dielectric layer having a top surface that is proximate to the top surface of the electrode stack, the top surface of the second dielectric layer being more recessed toward the semiconductor layer than the top surface of the first dielectric layer, and a third dielectric layer filling a remaining portion of the first trench and covering the top surface of the second dielectric layer.

BRIEF DESCRIPTION OF THE DRAWINGS

FIGS. 3A, 3B, 3C, 3D, 3E, 3F, 3G, 3H, 3I, 3J, 3K, and 3L illustrate cross-sectional views showing a method of manufacturing a semiconductor device according to some example embodiments of the present inventive concepts.

FIGS. 3E and 3F illustrate enlarged cross-sectional views showing section P1 of FIG. 3D.

FIGS. 4A, 4B, 4C, 4D, 4E, and 4F illustrate cross-sectional views showing a method of manufacturing a semiconductor device according to some example embodiments of the present inventive concepts.

FIGS. 4C and 4D illustrate enlarged cross-sectional views showing section P2 of FIG. 4B.

DETAILED DESCRIPTION OF EMBODIMENTS

The following will now describe in detail a gap-fill method and a semiconductor device manufactured by the same in conjunction with the accompanying drawings.

FIGS. 1A, 1B, 1C, 1D, 1E, 1F, 1G, 1H, and 1I illustrate cross-sectional views showing a method of forming a gap-fill layer according to some example embodiments of the present inventive concepts.

Figure 1A:
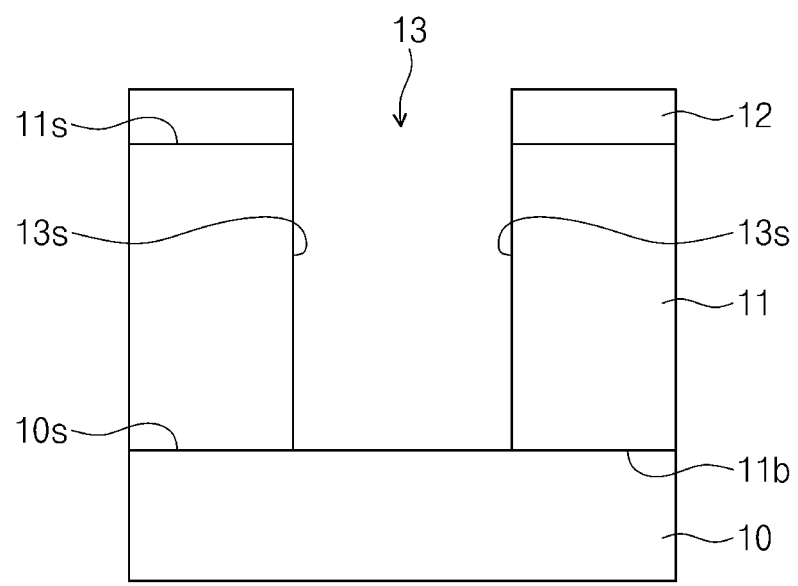
FIGS. 1A, 1B, 1C, 1D, 1E, 1F, 1G, 1H, and 1I illustrate cross-sectional views showing a method of forming a gap-fill layer according to some example embodiments of the present inventive concepts.

Referring to FIG. 1A, a trench 13 may be formed in (e.g., may be defined by) an upper layer 11 on a lower layer 10. For example, the upper layer 11 may be formed on the lower layer 10, and a polish stop layer 12 may be formed on the upper layer 11. The polish stop layer 12 may be formed on the upper layer 11 prior to forming the trench 13. The lower layer 10 may include an arbitrary material layer. For example, the lower layer 10 may be a dielectric layer, a conductive layer, a semiconductor layer, or a semiconductor wafer. The upper layer 11 may include a dielectric layer, a conductive layer, a semiconductor layer, or a combination thereof. In some example embodiments, the upper layer 11 may include a plurality of stacked layers that are sequentially stacked on the lower layer 10, where the plurality of stacked layers includes a dielectric layer, a conductive layer, or a combination thereof. In some example embodiments, forming the upper layer 11 may include forming, on the lower layer 10, a dielectric layer, a conductive layer, a semiconductor layer, a sub-combination thereof, or a combination thereof.

As described herein, an element that is "on" another element may be "above" or "beneath" the other element. Additionally, an element that is "on" another element may be "directly" on the other element, such that the two elements are in direct contact with each other, or the element may be "indirectly" on the other element, such that the two elements are isolated from direct contact with each other by one or more interposing elements and/or spaces.

When the upper layer 11 includes a plurality of stacked dielectric layers, the dielectric layers may be of the same or different kinds. For example, the upper layer 11 may include silicon oxide layers and silicon nitride layers that are alternately and repeatedly stacked. The upper layer 11 may further include a semiconductor layer and a lower dielectric layer that are provided below the silicon oxide layers and the silicon nitride layers. For example, the lower dielectric layer may be disposed below the semiconductor layer.

The polish stop layer 12 may include silicon nitride (e.g., SiN), polysilicon, or metal nitride (e.g., TiN) that is deposited to have a relatively great thickness (e.g., about 100 Å to about 4,000 Å). The trench 13 may be formed by an etching process or a drilling process. The trench 13 may have a depth that penetrates the polish stop layer 12 and the upper layer 11 and approaches the lower layer 10. Restated, the trench 13 may extend from a top surface 11s of the upper layer 11 towards the lower layer 10. For example, the trench 13 may have a depth sufficient enough to expose the lower layer 10, such that the trench 13 extends from the top surface 11s of the upper layer to a bottom surface 11b of the upper layer 11.

Figure 1B:
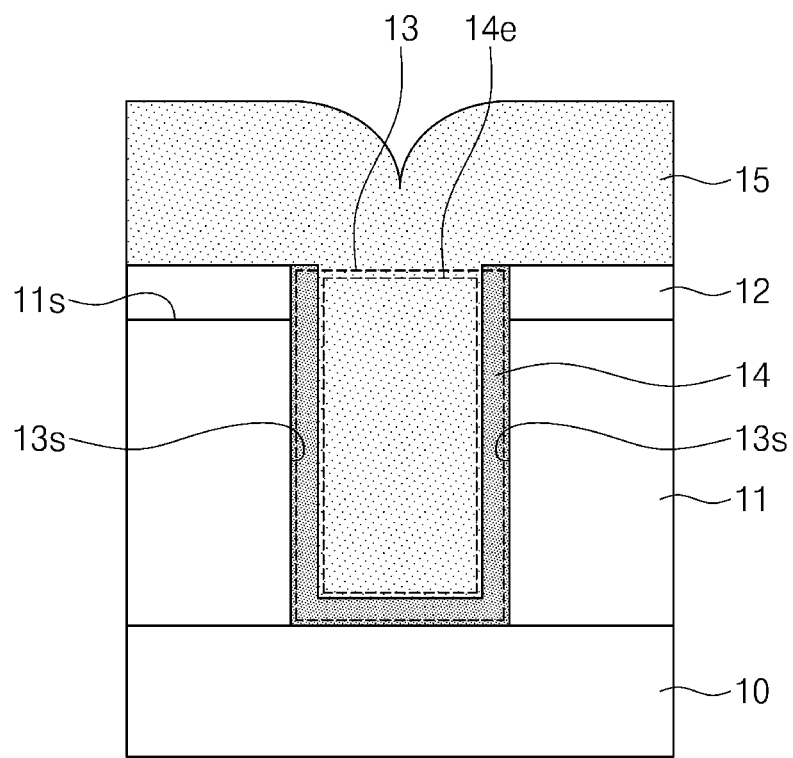

Referring to FIG. 1B, a plurality of dielectric materials may be deposited, in the trench 13, to form a first dielectric layer 14 and a second dielectric layer 15 that fill the trench 13. As shown in at least FIG. 1B, the first dielectric layer 14 may fill a first portion of the trench 13, which may be an outer and lower portion of the trench 13, and the second dielectric layer 15 may fill a separate, second portion of the trench 13, which may be a central portion of the trench 13. For example, as shown in FIG. 1B, the first dielectric layer 14 may be formed to extend along an inner sidewall surface 13s of the trench 13, and the second dielectric layer 15 may be formed to fill a portion of the trench 13 in which the first dielectric layer 14 is formed. As further shown in at least FIG. 1B, the first dielectric layer 14 may have a U shape that extends along an inner sidewall surface 13s of the trench 13.

The first and second dielectric layers 14 and 15 may be different in density and deposition rate. In certain embodiments, the first dielectric layer 14 may be formed by depositing a high-density dielectric material, and the second dielectric layer 15 may be formed by depositing a low-density dielectric material. Accordingly, the first dielectric layer 14 may have a density (e.g., an average density of an entirety of the first dielectric layer 14) that is greater than a density of the second dielectric layer 15 (e.g., an average density of an entirety of the first dielectric layer 15). For example, the first dielectric layer 14 may be formed by depositing high-density plasma (HDP) oxide and patterning the HDP oxide. The first dielectric layer 14 may be formed to have a shape extending along an inner surface of the trench 13. For example, the first dielectric layer 14 may have a pipe or U shape that is upwardly open (e.g., a U shape that defines an open enclosure 14e that is open towards the top surface 11s of the upper layer 11). The forming of the first dielectric layer 14 may include depositing, in the trench 13, a dielectric material having a density that is greater than a density of the second dielectric layer 15, and the forming the second dielectric layer 15 may include depositing, in the trench 13 and on the first dielectric layer 14, a dielectric material having a density that is less than the density of the first dielectric layer 14, where the second dielectric layer 15 fills an open enclosure 14e defined by the first dielectric layer 14. In some example embodiments, forming the second dielectric layer 15 may include depositing a dielectric material that is different from a dielectric material of the first dielectric layer 14, where the deposited dielectric material fills the trench 13 and covers the upper layer 11, as shown in FIG. 1B.

Because the first dielectric layer 14 has a high density, voids may hardly occur in the first dielectric layer 14 and thus the occurrence of cracks originating from the voids may be avoided or markedly reduced when an annealing process is subsequently performed. The second dielectric layer 15 may include tetraethylorthosilicate (TEOS) oxide that is deposited to have a thickness sufficient enough to cover the polish stop layer 12 as well as to fill the trench 13 in which the first dielectric layer 14 is formed. The second dielectric layer 15 may be formed at a higher deposition rate than that at which the first dielectric layer 14 is formed. Because the second dielectric layer 15 is deposited at high rate, the trench 13 may be relatively promptly filled with the second dielectric layer 15.

Figure 1C:
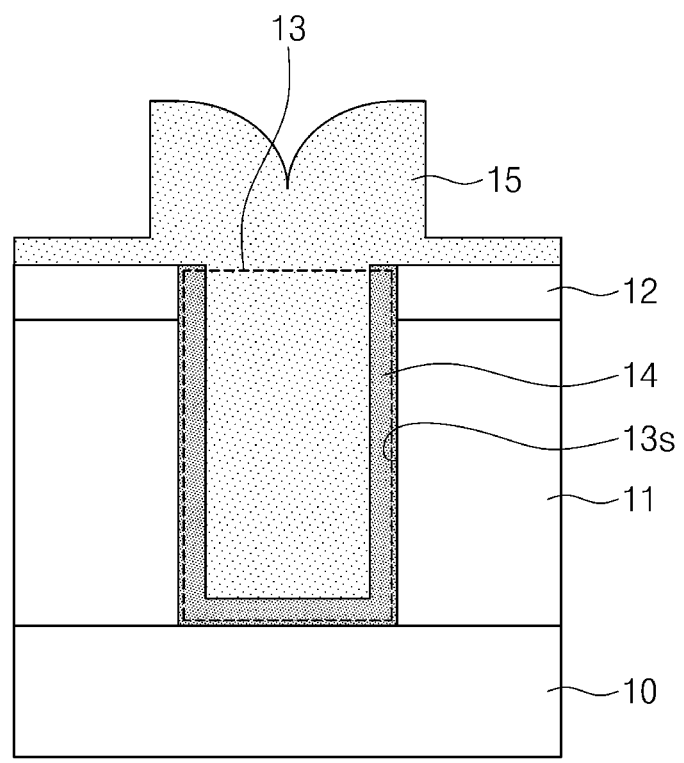

Referring to FIG. 1C, the second dielectric layer 15 may be partially removed such that the second dielectric layer 15 may remain on the trench 13. For example, the second dielectric layer 15 may undergo an open process where a photolithography process and an etching process are performed to restrict or open a certain location such as a cell memory region of a semiconductor device. Therefore, the second dielectric layer 15 may be partially or completely removed on the polish stop layer 12, and may remain on the trench 13. It may be optional, not essential, to perform the open process.

Figure 1D:
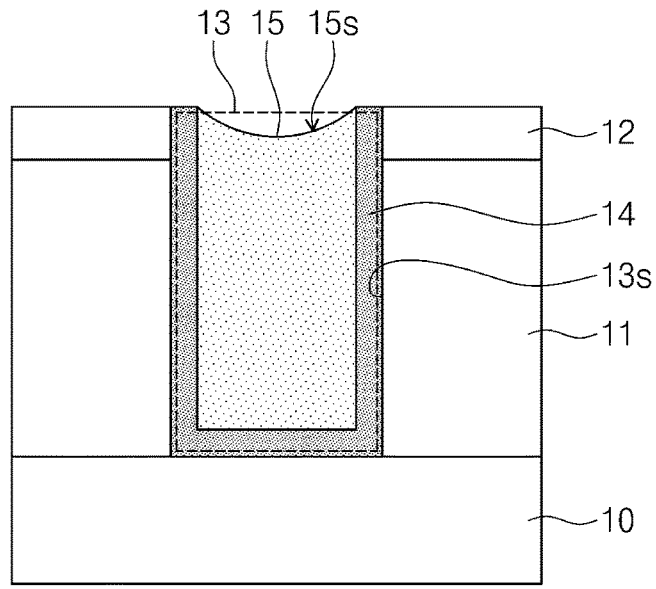

Referring to FIG. 1D, a planarization process may be performed on the second dielectric layer 15. For example, a chemical mechanical polishing (CMP) process may be performed to planarize the second dielectric layer 15. The CMP process may continue until the polish stop layer 12 is revealed. After the second dielectric layer 15 is formed as shown in FIG. 1B, the CMP process may be performed without performing the open process of FIG. 1C. In this case, the CMP process may be easily performed because the polish stop layer 12 has a relatively flat surface or the degree of non-flatness is not heavy even if the polish stop layer 12 has a non-flat surface. Accordingly, in some example embodiments, including the example embodiments shown in at least FIGS. 1C-1D, the forming of the second dielectric layer 15 may include performing a polishing process to planarize the deposited dielectric material of the second dielectric layer 15.

Alternatively, the CMP process may be performed after the open process of FIG. 1C is carried out. In this case, an etching burden may be reduced because an etching amount of the second dielectric layer 15 becomes small. The second dielectric layer 15 may have a top surface 15s that is concave due to dishing caused by the CMP process. Alternatively, the top surface 15s of the second dielectric layer 15 may be flat.

When an annealing process is subsequently performed after the CMP process, the first and second dielectric layers 14 and 15 may have their top ends at different levels, where the "level" may be understood to refer to a height in relation to the lower layer 10 and/or a top surface 10s of the lower layer 10, due to a difference in contraction rate between the first and second dielectric layers 14 and 15. In addition, when voids occur at the formation of the first and second dielectric layers 14 and 15 discussed above with reference to FIG. 1B, the voids may serve as crack sources. In certain embodiments, no annealing process may be performed after the CMP process, and instead, a process discussed below with reference to FIG. 1E may be performed to avoid or significantly reduce the occurrence of cracks.

Figure 1E:
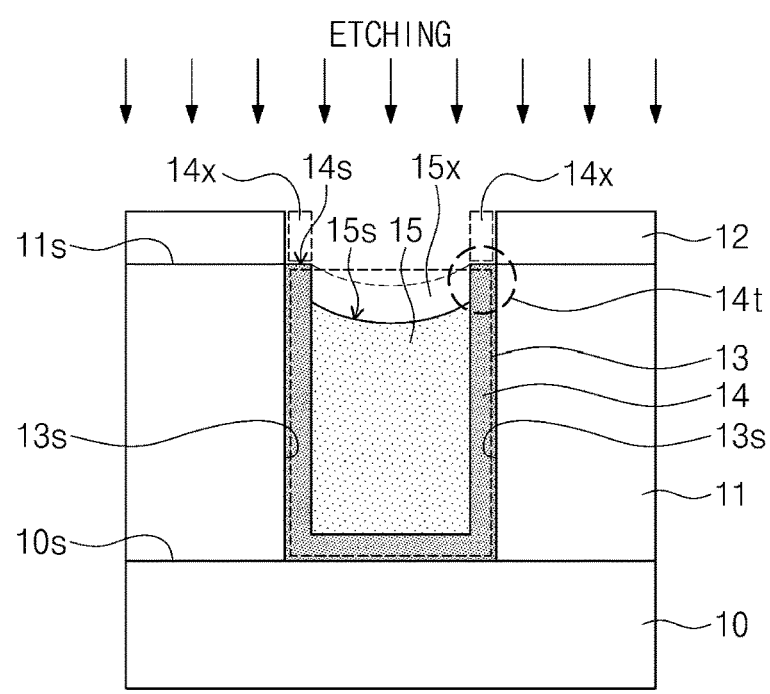

Referring to FIG. 1E, an etching process may be performed to partially remove the first and second dielectric layers 14 and 15. A wet etching process may be performed as the etching process. The partial removal may recess the first and second dielectric layers 14 and 15. In certain embodiments, the first and second dielectric layers 14 and 15 may be etched not enough to protrude beyond the upper layer 11. Thus, the top surface 14s of the recessed first dielectric layer 14 may be located at a level the same as or similar to that of a top surface 11s of the upper layer 11. Restated, and as shown in at least FIG. 1E, a top surface 14s of the first dielectric layer 14, which may include a top surface of each top end 14t of the at least two top ends 14t of the first electric layer 14, may be at a level that is equal to or less than a level of the top surface 11s of the upper layer 11 over the top surface 10s of the lower layer 10. It will be understood that the top surfaces of each top end 14t may at least partially comprise the top surface 14s of the first dielectric layer 14. As a result, it will be understood, with regard to at least FIG. 1E, that an etching process may include recessing a top surface 14s of the first dielectric layer 14 and a top surface 15s of the second dielectric layer 15 away from the top surface 11s of the upper layer 11 and toward the lower layer 10, the top surface 15s of the second dielectric layer being recessed more further toward the lower layer 10 than the top surface 14s of the first dielectric layer 14.

An etching amount of the low-density second dielectric layer 15 may be greater than that of the high-density first dielectric layer 14. Due to such difference in etching amount, the top surface 15s of the recessed second dielectric layer 15 may be located at a lower level than that of the top surface 14s of the recessed first dielectric layer 14. Because the top surface 15s of the second dielectric layer 15 is located at a lower level than that of the top surface 14s of the first dielectric layer 14, the first dielectric layer 14 may have two separated top ends 14t that protrude above the top surface 15s of the second dielectric layer 15. The top end 14t of the first dielectric layer 14 may be located at a level the same as or similar to that of the top surface 11s of the upper layer 11. Accordingly, as shown in at least FIG. 1E, the first dielectric layer 14 may fill a first portion of the trench 13 and may have a top surface 14s that is proximate to the top surface 11s of the upper layer 11, while the second dielectric layer 15 may fill a separate, second portion of the trench 13 and may have a top surface 15s that is proximate to the top surface 11s of the upper layer 11 and the top surface 15s of the second dielectric layer 15 may be more recessed toward the lower layer 10 than the top surface 14s of the first dielectric layer 14. As further shown in at least FIG. 1E, the first dielectric layer 14 may have a U shape, such that the first dielectric layer 14 includes at least two top ends 14t that are each on separate, respective inner sidewall surfaces 13s of the trench 13 and are each adjacent to the top surface 11s of the upper layer 11.

As shown in at least FIG. 1E, recessing the first dielectric layer 14 and the second dielectric layer 15 may include performing an etching process to remove respective upper portions 14x and 15x of the first dielectric layer 14 and second dielectric layer 15, where the recessed first dielectric layer 14 has a top end 14t that protrudes above the top surface 15s of the recessed second dielectric layer 15 (e.g., the top end 14t of the recessed first dielectric layer 14 is more distal to the top surface 10s of the lower layer 10 in relation to the top surface 15s of the recessed second dielectric layer 15, as shown in FIG. 1E). As further shown in at least FIG. 1E, separate top ends 14t of the first dielectric layer 14 may be isolated from direct contact with each other across the open enclosure 14e.

Figure 1F:
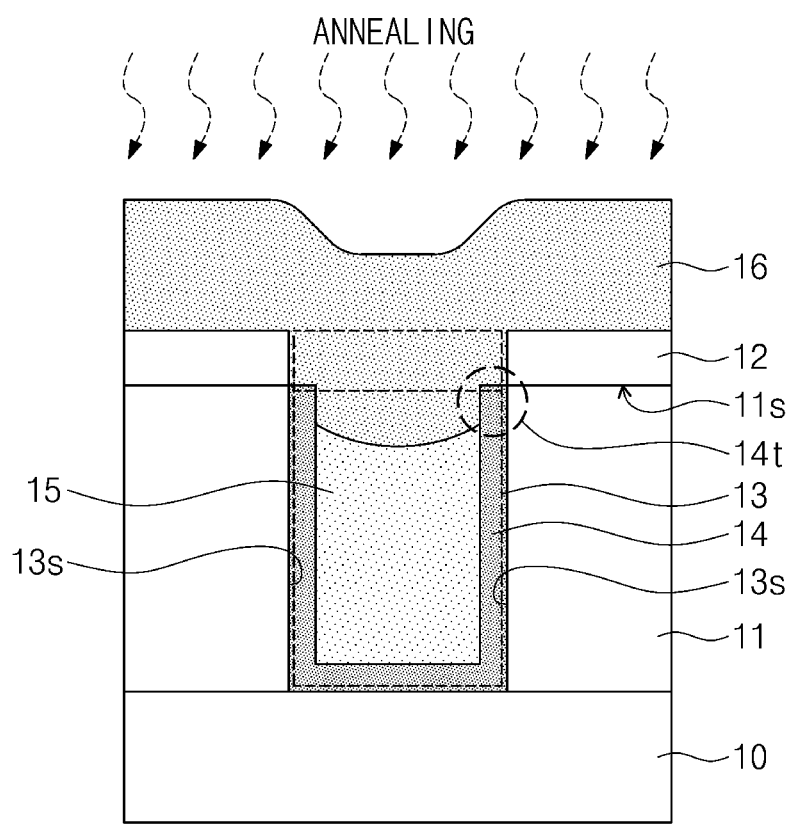

Referring to FIG. 1F, a third dielectric layer 16 may be formed on the lower layer 10, and an annealing process may be performed. The third dielectric layer 16 may be formed by depositing an identical or similar dielectric material, such as tetraethylorthosilicate (TEOS) oxide, to that of the second dielectric layer 15. Accordingly, in some example embodiments, the second and third dielectric layers 15 and 16 may have a same or substantially same material composition (e.g., a same material composition within manufacturing tolerances and/or material tolerances), and the forming the third dielectric layer 16 may include depositing a dielectric material that is a same material as a dielectric material of the second dielectric layer 15, the deposited dielectric material filling the trench 13 and covering the upper layer 11, and annealing the first dielectric layer, second dielectric layer and the deposited dielectric material.

The third dielectric layer 16 may be formed to have a thickness sufficient enough to fill the trench 13 in which the first and second dielectric layers 14 and 15 are formed, covering the polish stop layer 12. The annealing process may be performed after the third dielectric layer 16 is formed.

As discussed above with reference to FIG. 1E, the etching process may cause the first dielectric layer 14 to have the protruding top end 14t. The phrase "the first dielectric layer 14 may have the protruding top end 14t." may mean that the etching process of FIG. 1E may remove a top end interface that is formed between the first and second dielectric layers 14 and 15 and is adjacent to the top surface 11s of the upper layer 11. When the first dielectric layer 14 has no protruding top end 14t and the third dielectric layer 16 is not formed, the annealing process may produce a difference in contraction rate between the first and second dielectric layers 14 and 15, and the difference in contraction rate may cause the first and second dielectric layers 14 and 15 to come apart from each other to create at the top end interface a chasm from which voids may propagate. As such, because the etching process of FIG. 1E removes the top end interface capable of serving as a crack source and the third dielectric layer 16 is formed to cover the first and second dielectric layers 14 and 15, the occurrence of cracks may be suppressed in the trench 13.

Figure 1G:
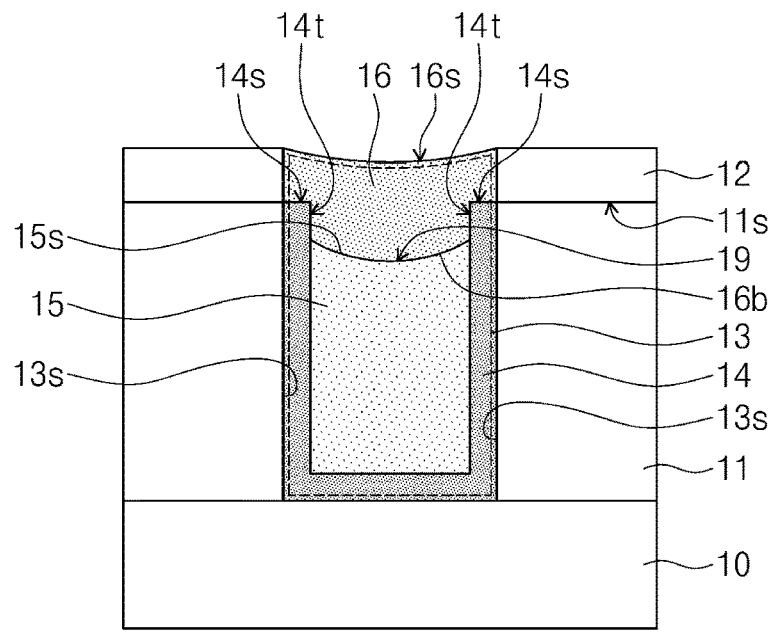

Referring to FIG. 1G, a planarization process may be performed on the third dielectric layer 16. For example, a chemical mechanical polishing (CMP) process may be performed to planarize the third dielectric layer 16. Accordingly, the forming the third dielectric layer 16 may include performing a polishing process to planarize the annealed dielectric material. The CMP process may continue until the polish stop layer 12 is revealed. The third dielectric layer 16 may have a top surface 16s that is concave due to dishing caused by the CMP process. Alternatively, the top surface 16s of the third dielectric layer 16 may be flat. As shown in at least FIG. 1H, the second and third dielectric layers 15 and 16 may have therebetween an interface 19, defined by the direct contact between the top surface 15s of the second dielectric layer 15 and a bottom surface 16b of the third dielectric layer 16, that is concave toward the lower layer 10.

Figure 1H:
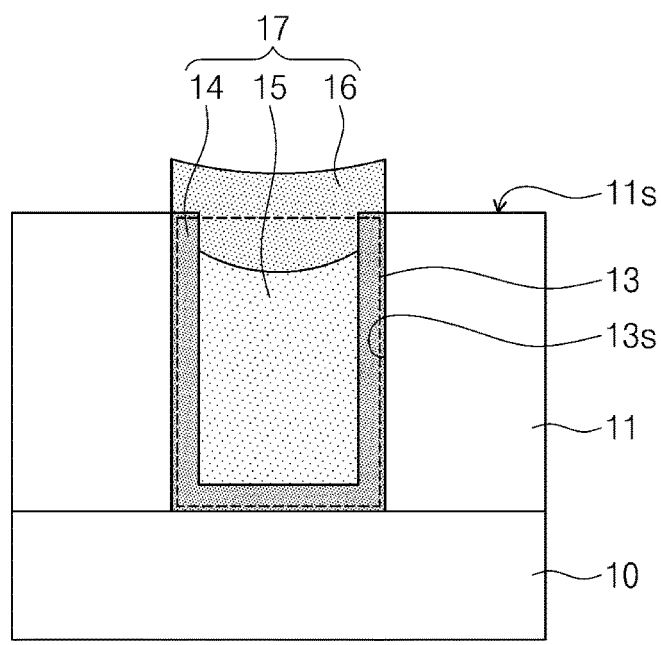

Referring to FIG. 1H, the polish stop layer 12 may be selectively removed. Therefore, a gap-fill layer 17 may be formed to fill the trench 13 and to have no possibility of the occurrence of cracks. The gap-fill layer 17 may have a multi-layered structure in which the first, second, and third dielectric layers 14, 15, and 16 are included. The third dielectric layer 16 may cover the first and second dielectric layers 14 and 15 and may protrude above the top surface 11s of the upper layer 11. As shown in FIG. 1H, forming the third dielectric layer 16 may include removing the polish stop layer 12 after performing the polishing process, such that the planarized dielectric material of the third dielectric layer is protrudes above the upper layer 11.

Figure 1I:
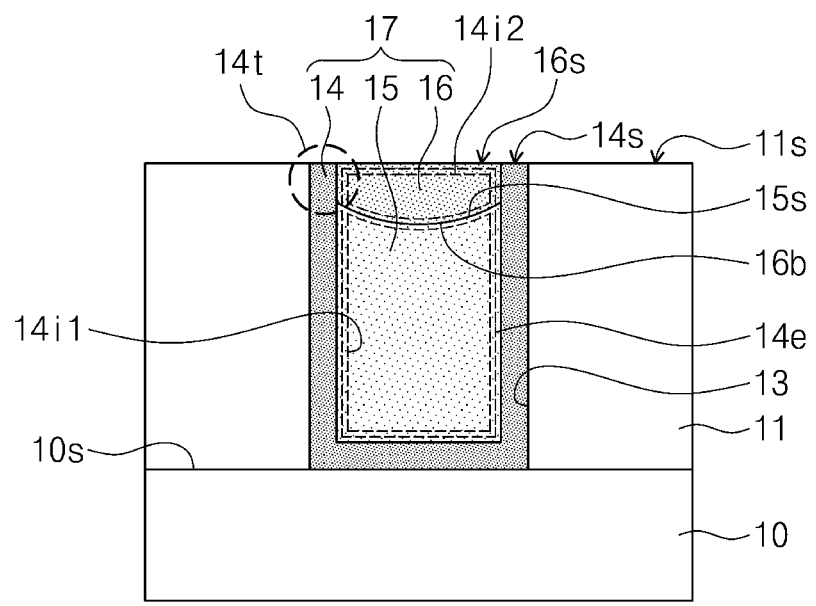

Optionally, as shown in FIG. 1I, a buffering chemical mechanical polishing process may further be performed to remove the third dielectric layer 16 that protrudes above the top surface 11s of the upper layer 11. Accordingly, and as shown in FIG. 1I, the forming of the third dielectric layer 16 may include polishing the dielectric material of the third dielectric layer 16 that protrudes above the upper layer 11. The gap-fill layer 17 may have a shape in which the second and third dielectric layers 15 and 16 are sequentially stacked within the first dielectric layer 14 shaped like a pipe or U. The top surface 14s of the first dielectric layer 14 may be exposed at the top surface 11s of the upper layer 11. For example, the top surface 14s of the first dielectric layer 14 may be located at a level the same as or similar to that of the top surface 11s of the upper layer 11. Accordingly, and as shown in at least FIG. 1I, while the first dielectric layer 14 may fill a first portion of the trench 13, and the second dielectric layer 15 may fill a separate, second portion of the trench 13, the third dielectric layer 16 may fill a remaining portion of the trench 13, which is an entirety of the trench 13 that is not filled by the first and second dielectric layers 14 and 15, and the third dielectric layer 16 may cover the top surface 15s of the second dielectric layer 15. In some example embodiments, including the example embodiments shown in FIG. 1I, each top end 14t of the two top ends 14t of the first dielectric layer 14 is exposed at the top surface 11s of the upper layer 11.

In some example embodiments, including the example embodiments shown in at least FIG. 1I, the first dielectric layer 14 has a U shape that defines an open enclosure 14e that is open towards the top surface 11s of the upper layer 11, the second dielectric layer 15 fills a portion 14i1 of the open enclosure 14e of the first dielectric layer, and the third dielectric layer 16 fills a remaining portion 14i2 of the open enclosure 14e of the first dielectric layer 14, including the third dielectric layer 16 being between the top ends 14t of the first dielectric layer 14.

FIGS. 2A, 2B, 2C, and 2D illustrate cross-sectional views showing a method of forming a gap-fill layer according to some example embodiments of the present inventive concepts.

Figure 2A:
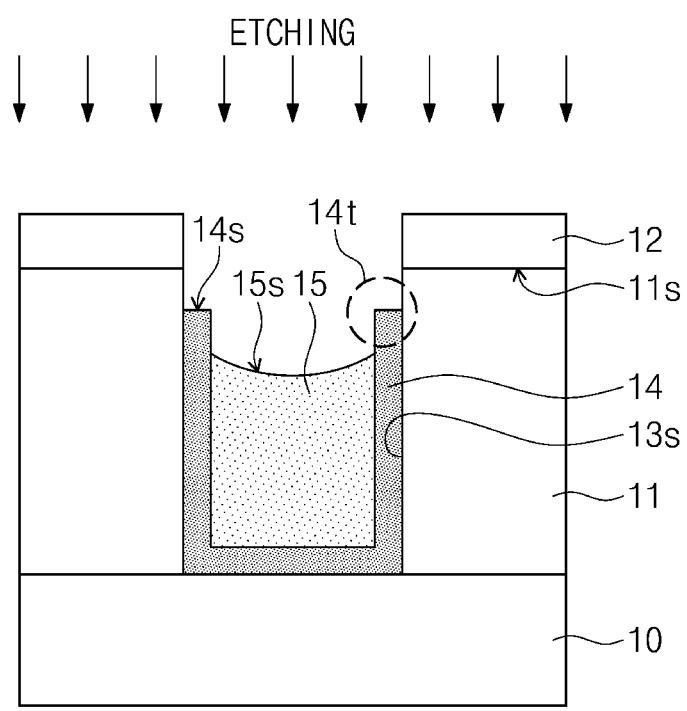
FIGS. 2A, 2B, 2C, and 2D illustrate cross-sectional views showing a method of forming a gap-fill layer according to some example embodiments of the present inventive concepts.

Referring to FIG. 2A, processes identical or similar to those discussed above with reference to FIGS. 1A to 1E may be performed to form the trench 13 in the upper layer 11 on the lower layer 10, to form the first and second dielectric layers 14 and 15 in the trench 13, and then to planarize the second dielectric layer 15. Thereafter, an etching process may be performed to recess the first and second dielectric layers 14 and 15. In certain embodiments, the first and second dielectric layers 14 and 15 may be recessed to a level below the top surface 11s of the upper layer 11. Thus, the top surface 14s of the recessed first dielectric layer 14 may be located at a lower level than that of the top surface 11s of the upper layer 11. The top surface 15s of the recessed second dielectric layer 15 may be located at a lower level than that of the top surface 14s of the first dielectric layer 14. The top end 14t of the first dielectric layer 14 may be located at a level that does not approach the level of the top surface 11s of the upper layer 11. For example, the top surface 14s of the first dielectric layer 14 may be located at a lower level than that of the top surface 11s of the upper layer 11.

Figure 2B:
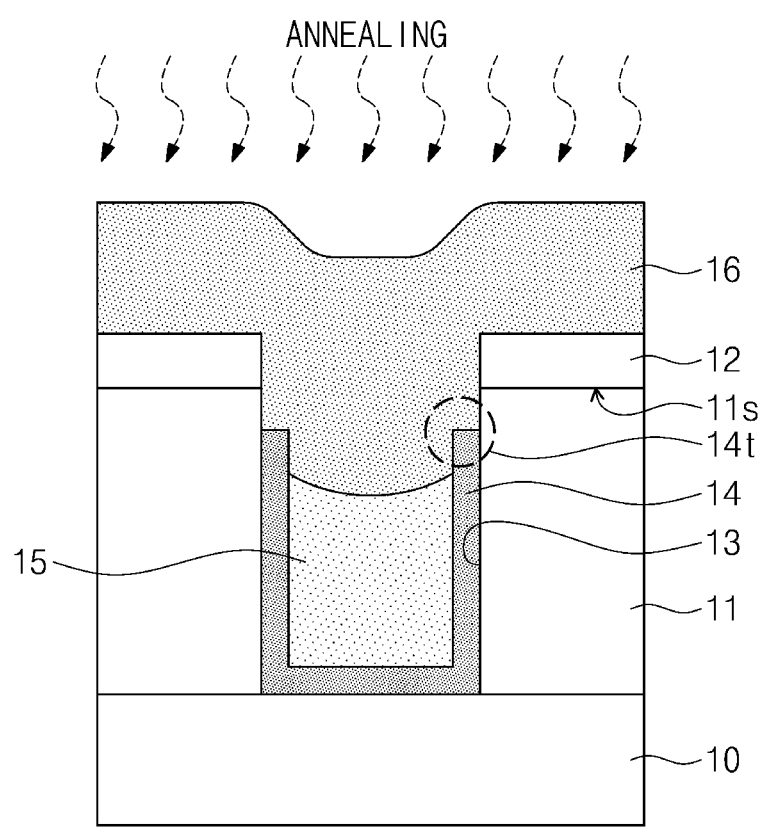

Referring to FIG. 2B, as discussed above with reference to FIG. 1F, the third dielectric layer 16 may be formed to have a thickness sufficient enough to fill the trench 13 and to cover the polish stop layer 12, and then an annealing process may be performed. The etching process of FIG. 2A may remove the top end interface between the first and second dielectric layers 14 and 15, and the third dielectric layer 16 may cover the first and second dielectric layers 14 and 15, with the result that the occurrence of cracks may be suppressed in the trench 13.

Figure 2C:
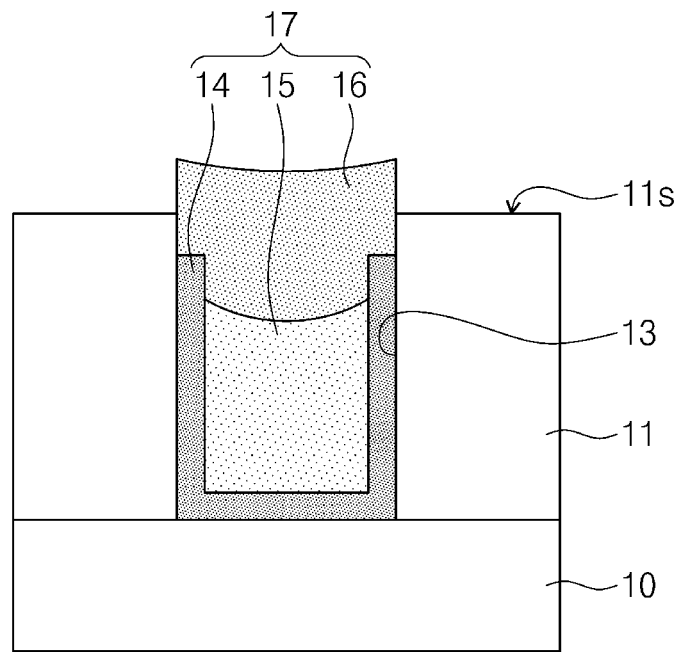
Figure 2D:
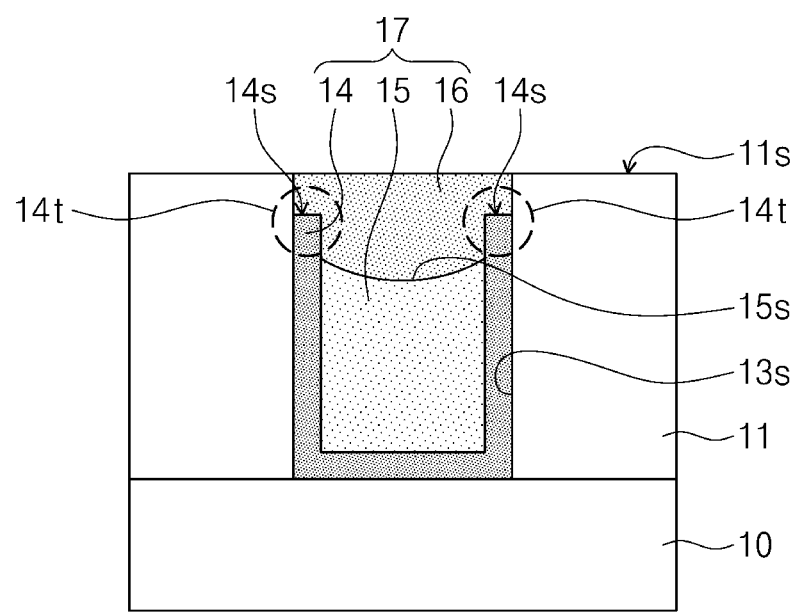

Referring to FIG. 2C, processes identical or similar to those discussed above with reference to FIGS. 1G and 1H may be performed to planarize the third dielectric layer 16 and to remove the polish stop layer 12, which processes may form the gap-fill layer 17 having a multi-layered structure in which the first, second, and third dielectric layers 14, 15, and 16 are included. Optionally, as shown in FIG. 2D, a buffering chemical mechanical polishing process may further be performed. In this case, the gap-fill layer 17 may have a shape in which the third dielectric layer 16 covers the pipe- or U-shaped first dielectric layer 14 filling the trench 13 and surrounding the second dielectric layer 15. As shown in FIG. 2D, the third dielectric layer 16 may further cover the top ends 14t of the first dielectric layer 14. Accordingly, in some example embodiments, including the example embodiments shown in FIG. 2D, a third dielectric layer 16 may be formed to cover the top surface 14s of the first dielectric layer 14 and the top surface 15s of the second dielectric layer 15, in addition to being between the top ends 14t of the first dielectric layer 14.

Figure 3A:
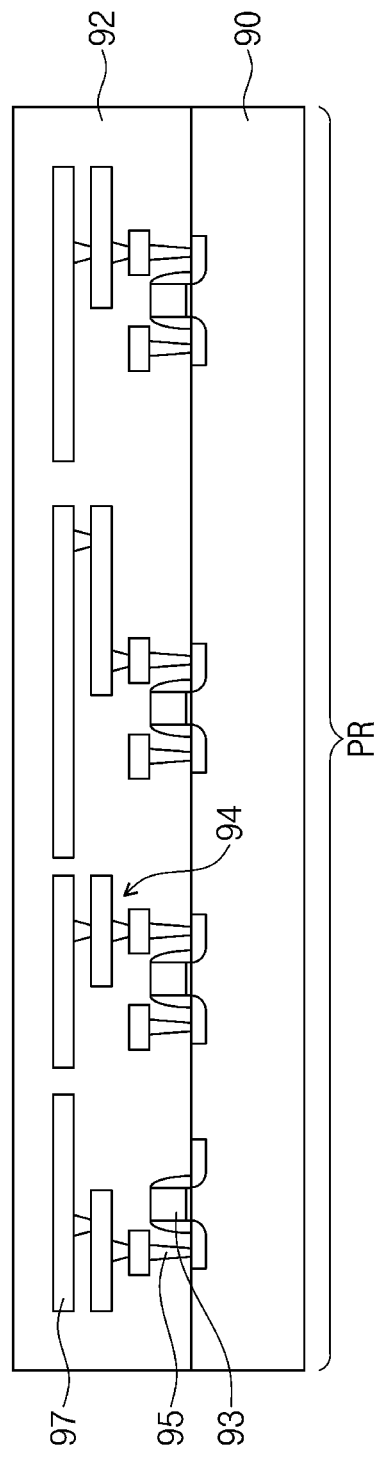
Figure 3B:
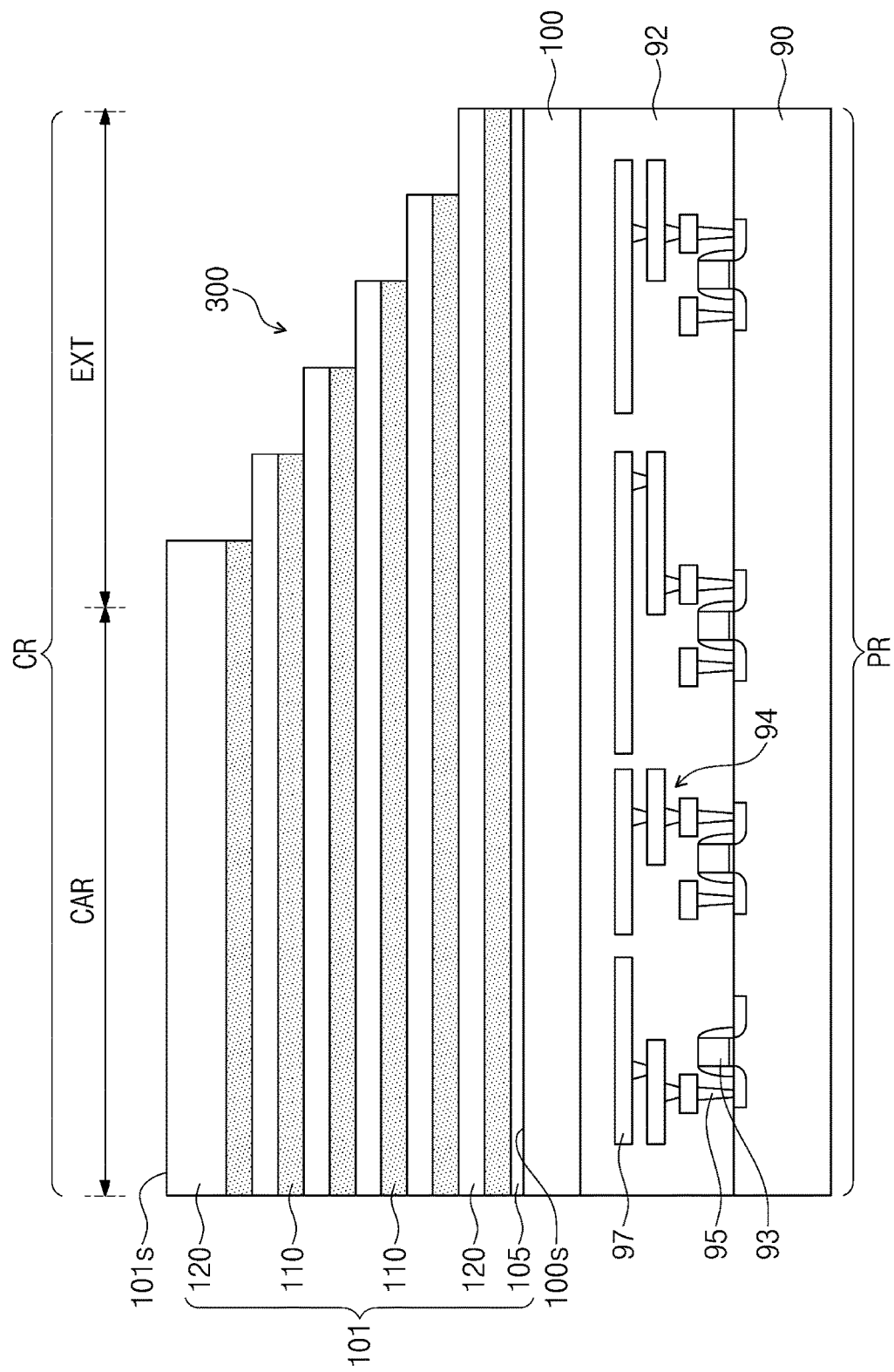
Figure 3C:
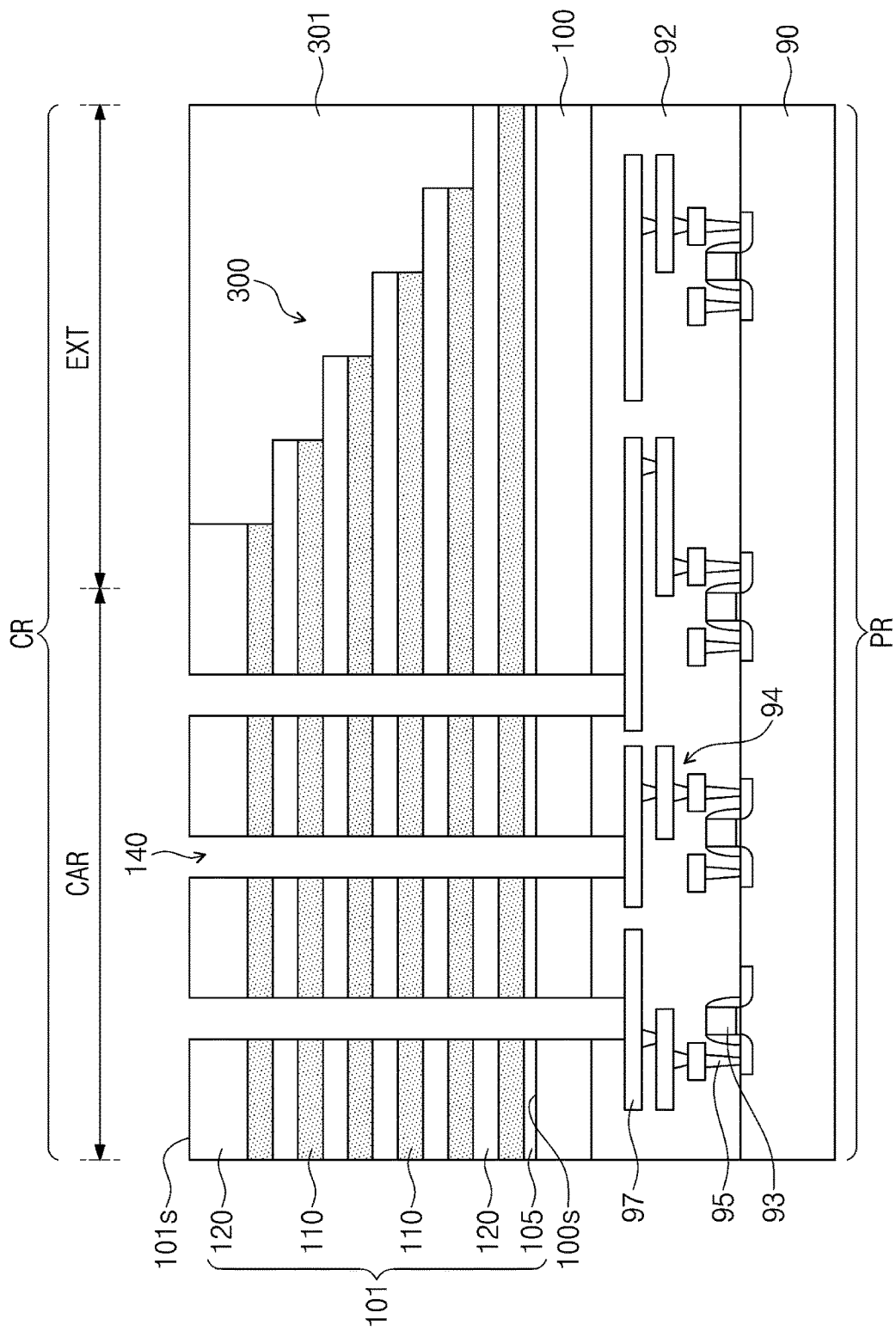
Figure 3D:
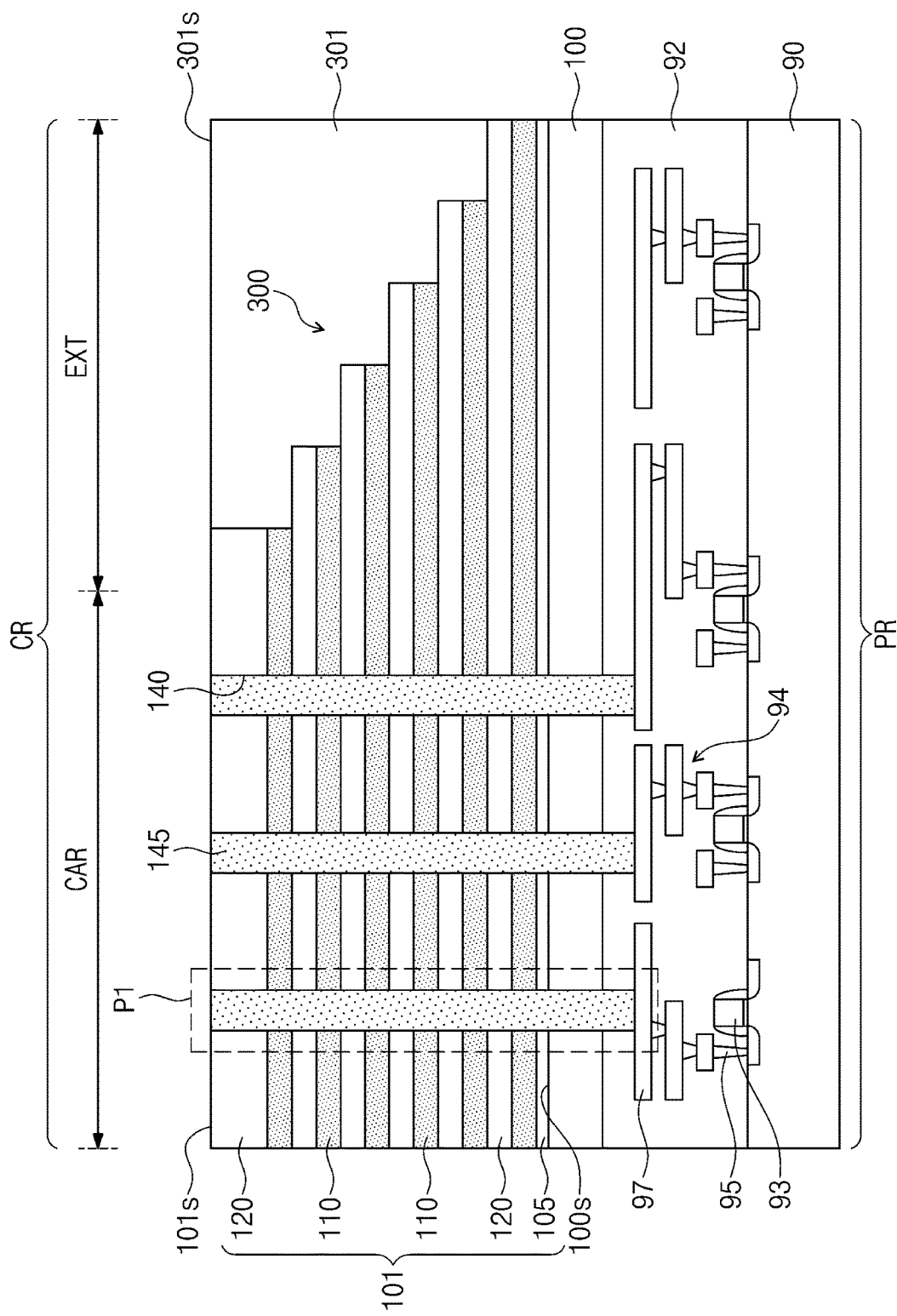
Figure 3E:
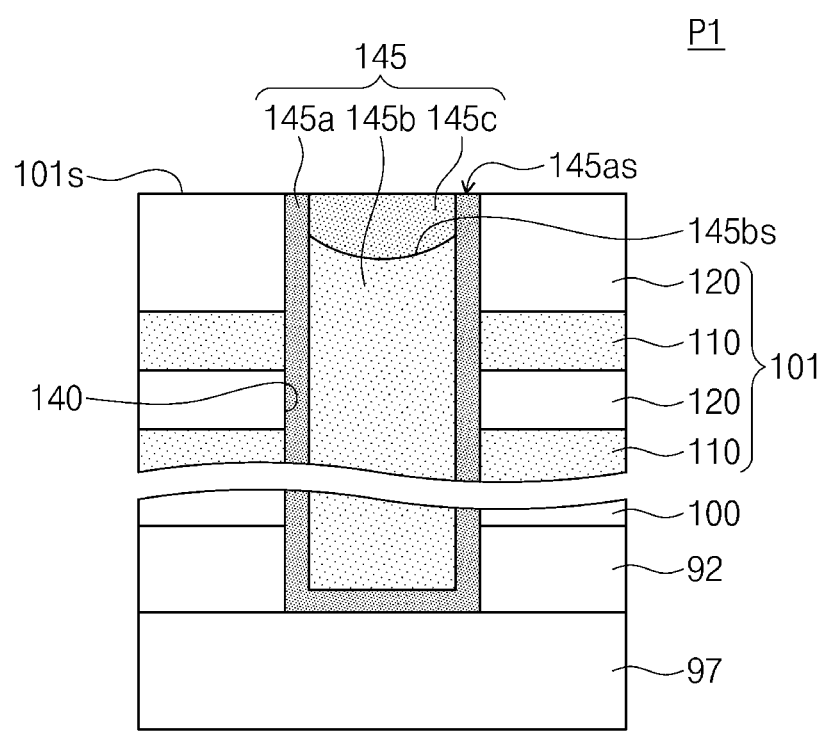
Figure 3F:
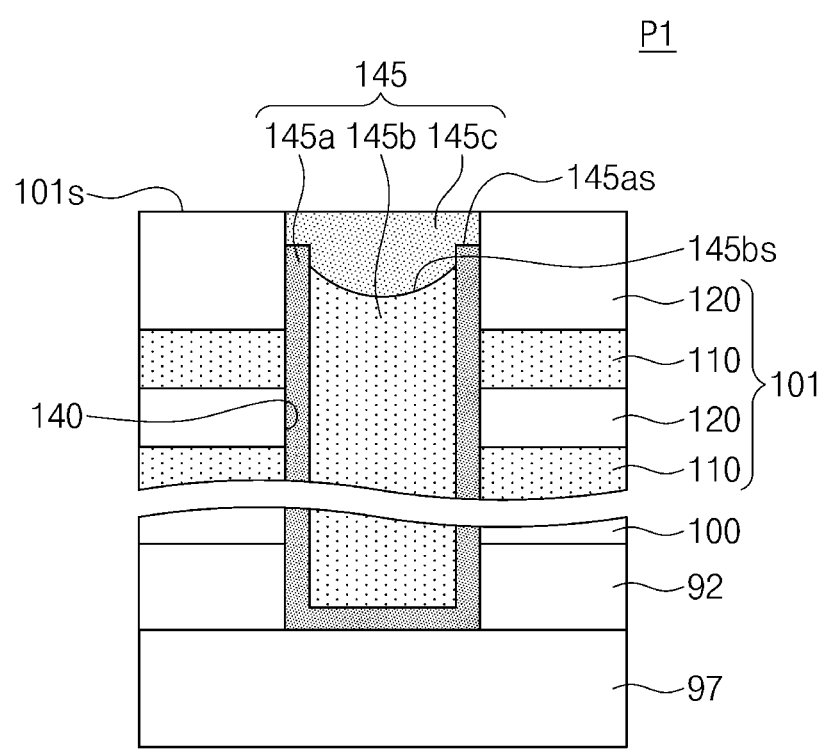

FIGS. 3A, 3B, 3C, 3D, 3E, 3F, 3G, 3H, 3I, 3J, 3K, and 3L illustrate cross-sectional views showing a method of manufacturing a semiconductor device according to some example embodiments of the present inventive concepts. FIGS. 3E and 3F illustrate enlarged cross-sectional views showing section P1 of FIG. 3D.

Referring to FIG. 3A, a substrate 90 may be provided thereon with a peripheral region PR that includes a peripheral circuit 94. The peripheral circuit 94 may include a plurality of transistors 93 formed on the substrate 90, a plurality of metal lines 97 electrically connected to the plurality of transistors 93, and a plurality of metal contacts 95 between the transistors 93 and the metal lines 97 and between the metal lines 97 themselves. The substrate 90 may be a semiconductor substrate such as a single crystalline silicon wafer. The peripheral region PR may further include a lower dielectric layer 92 covering the peripheral circuit 94 on the substrate 90.

Referring to FIG. 3B, a semiconductor layer 100 may be formed on the peripheral region PR, and a mold 101 having a stepwise structure 300 may be formed on the semiconductor layer 100. The semiconductor layer 100 may include a polycrystalline silicon layer. The semiconductor layer 100 may be divided into a cell array region CAR and an extension region EXT. The cell array region CAR and the extension region EXT may constitute a cell region CR provided on the peripheral region PR. The stepwise structure 300 may be formed by repeatedly performing an etching process on a portion of the mold 101 and also a trimming process on an etching mask. The stepwise structure 300 may be formed on the extension region EXT.

The mold 101 may be formed by alternately and repeatedly stacking a plurality of mold sacrificial layers 110 and a plurality of mold dielectric layers 120 on the semiconductor layer 100. A dielectric buffer layer 105 may further be formed between the semiconductor layer 100 and a lowermost mold sacrificial layer 110. The mold sacrificial layers 110 and the mold dielectric layers 120 may be formed of dielectric materials having an etch selectivity with respect to each other. The dielectric buffer layer 105 may be formed of a dielectric material the same as or similar to that of the mold dielectric layers 120. For example, the mold sacrificial layers 110 may include silicon nitride, and the mold dielectric layers 120 and the dielectric buffer layer 105 may include silicon oxide.

Referring to FIG. 3C, one or more trenches 140 may be formed on the cell array region CAR. As shown in at least FIG. 3C, trench 140 (also referred to herein as a "first trench") may have a depth that penetrates the cell region CR and the peripheral region PR and approaches one of the metal lines 97. For example, a planarized dielectric layer 301 covering the stepwise structure 300 may be formed on the semiconductor layer 100, and an etching process may be performed on the cell array region CAR. The etching process may be performed such that the mold 101, the semiconductor layer 100, and the lower dielectric layer 92 may be etched to form the trenches 140 that approach the metal lines 97 of the peripheral region PR. For example, each of the trenches 140 may have a depth that approaches an uppermost metal line 97.

Referring to FIG. 3D, gap-fill layers 145 may be formed to fill the trenches 140. The gap-fill layers 145 may be formed by the gap-fill layer formation method discussed above with reference to FIGS. 1A to 1I or 2A to 2D. The description of FIGS. 1A to 1I or 2A to 2D may be incorporated into that of FIG. 3D.

For example, as shown in FIG. 3E, each of the gap-fill layers 145 may include first, second, and third dielectric layers 145a, 145b, and 145c provided in the trench 140 that penetrates the mold 101, the semiconductor layer 100, and the lower dielectric layer 92 and reveals the metal line 97. The first, second, and third dielectric layers 145a, 145b, and 145c may respectively correspond to the first, second, and third dielectric layers 14, 15, and 16 of FIG. 1I, and the mold 101 may correspond to the upper layer 11 of FIG. 1I, and the semiconductor layer 100 may correspond to the lower layer 10 of FIG. 1I. As shown in FIGS. 3E and 3F, the first dielectric layer 145a may fill a first portion of the trench 140, the first dielectric layer 145a having a top surface 145as that is proximate to a top surface 101s of the mold 101, the second dielectric layer 145b may fill a second portion of the trench 140, the second dielectric layer 145b having a top surface 145bs that is proximate to the top surface 101s of the mold 101, the top surface of the second dielectric layer being more recessed toward the semiconductor layer 100 than the top surface 145as of the first dielectric layer 145a, and a third dielectric layer 145c may fill a remaining portion of the trench 140 and may cover the top surface 145bs of the second dielectric layer 145b.

The gap-fill layer 145 may have a shape in which the second and third dielectric layers 145b and 145c are sequentially stacked within the first dielectric layer 145a shaped like a pipe or U (see also FIG. 1I). A top surface 145as of the first dielectric layer 145a may be exposed. Alternatively, as shown in FIG. 3F, each of the gap-fill layers 145 may have a shape in which the third dielectric layer 145c covers the pipe- or U-shaped first dielectric layer 145a surrounding the second dielectric layer 145b (see also FIG. 2D).

Referring to FIG. 3G, a plurality of vertical channel holes 150 and a plurality of dummy channel holes 250 may be formed to penetrate the mold 101. For example, the mold 101 may undergo an etching process to form the vertical channel holes 150 on the cell array region CAR and to form the dummy channel holes 250 on the extension region EXT. The vertical channel holes 150 and the dummy channel holes 250 may expose the semiconductor layer 100. One or more of the vertical channel holes 150 may be disposed between neighboring gap-fill layers 145. The dummy channel holes 250 may penetrate the planarized dielectric layer 301 and the stepwise structure 300 of the mold 101.

Figure 3H:
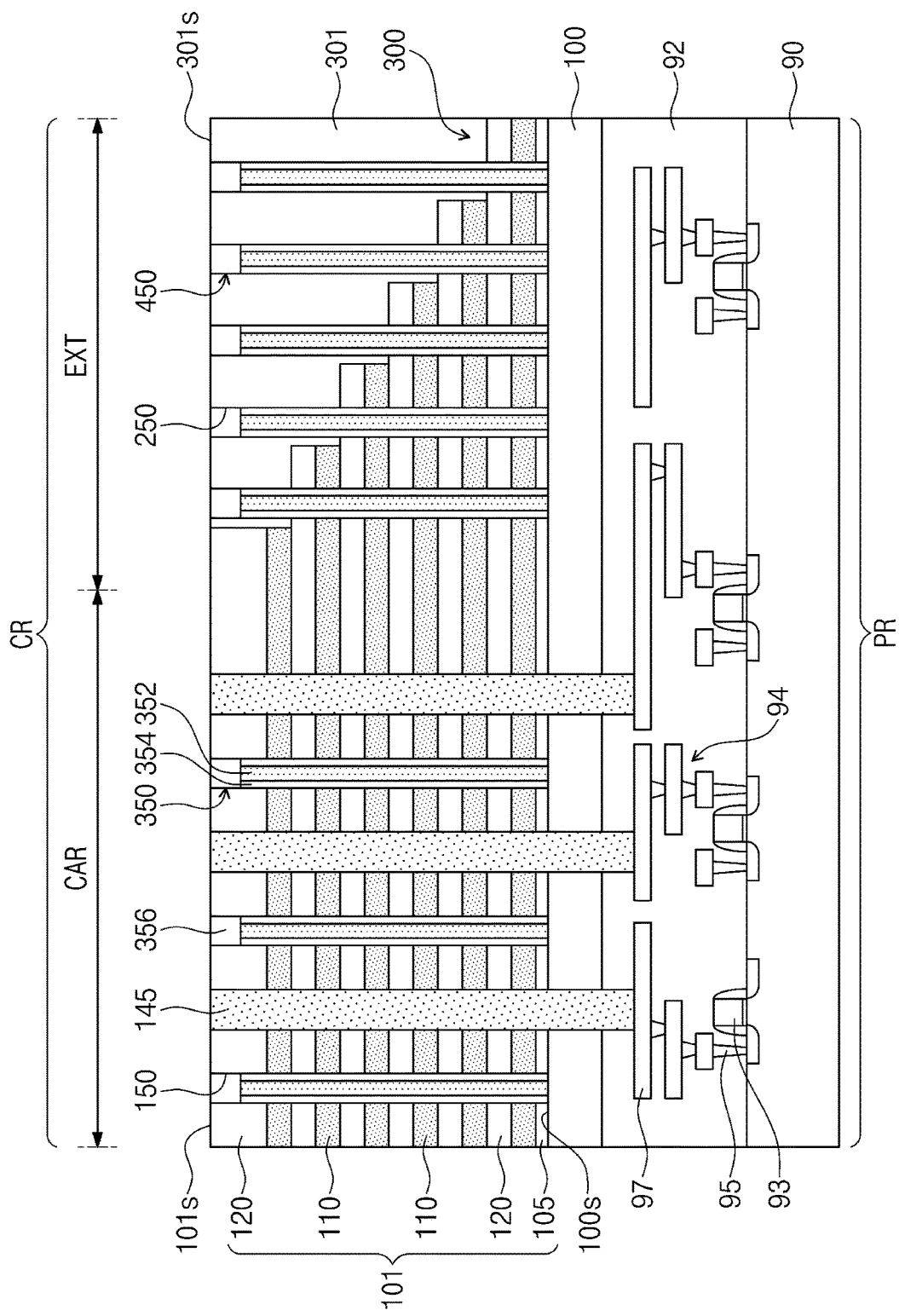

Referring to FIG. 3H, electrical vertical channels 350 may be formed in the vertical channel holes 150 on the cell array region CAR, and dummy vertical channels 450 may be formed in the dummy channel holes 250 on the extension region EXT. Accordingly, the electrical vertical channels 350 may be on the cell array region CAR, and the dummy vertical channels 450 may be on the extension region EXT. Each of the electrical vertical channels 350 may include a channel layer 352 and a memory layer 354 surrounding the channel layer 352. The memory layer 354 may include one or more dielectric layers. For example, the memory layer 354 may include a tunnel dielectric layer surrounding the channel layer 352, a blocking dielectric layer far away from the memory layer 354, and a charge storage layer between the tunnel dielectric layer and the blocking dielectric layer. The channel layer 352 may include polysilicon. The channel layer 352 may have a bulk shape or a hollow pipe shape. When the channel layer 352 has a hollow pipe shape, a dielectric layer may fill an empty inside of the channel layer 352.

A pad 356 may be formed on a top end of each of the electrical vertical channels 350. The pad 356 may be a conductor or an impurity-doped region. For example, the semiconductor layer 100 and the pad 356 may have opposite conductive types. The dummy vertical channels 450 may have the same structure as that of the electrical vertical channels 350. The electrical vertical channels 350 may be electrically connected to the semiconductor layer 100, and the dummy vertical channels 450 may not be electrically connected to the semiconductor layer 100. The dummy vertical channels 450 may serve as supports that suppress defects such as collapse of the stepwise structure 300 of the mold 101.

Figure 3I:
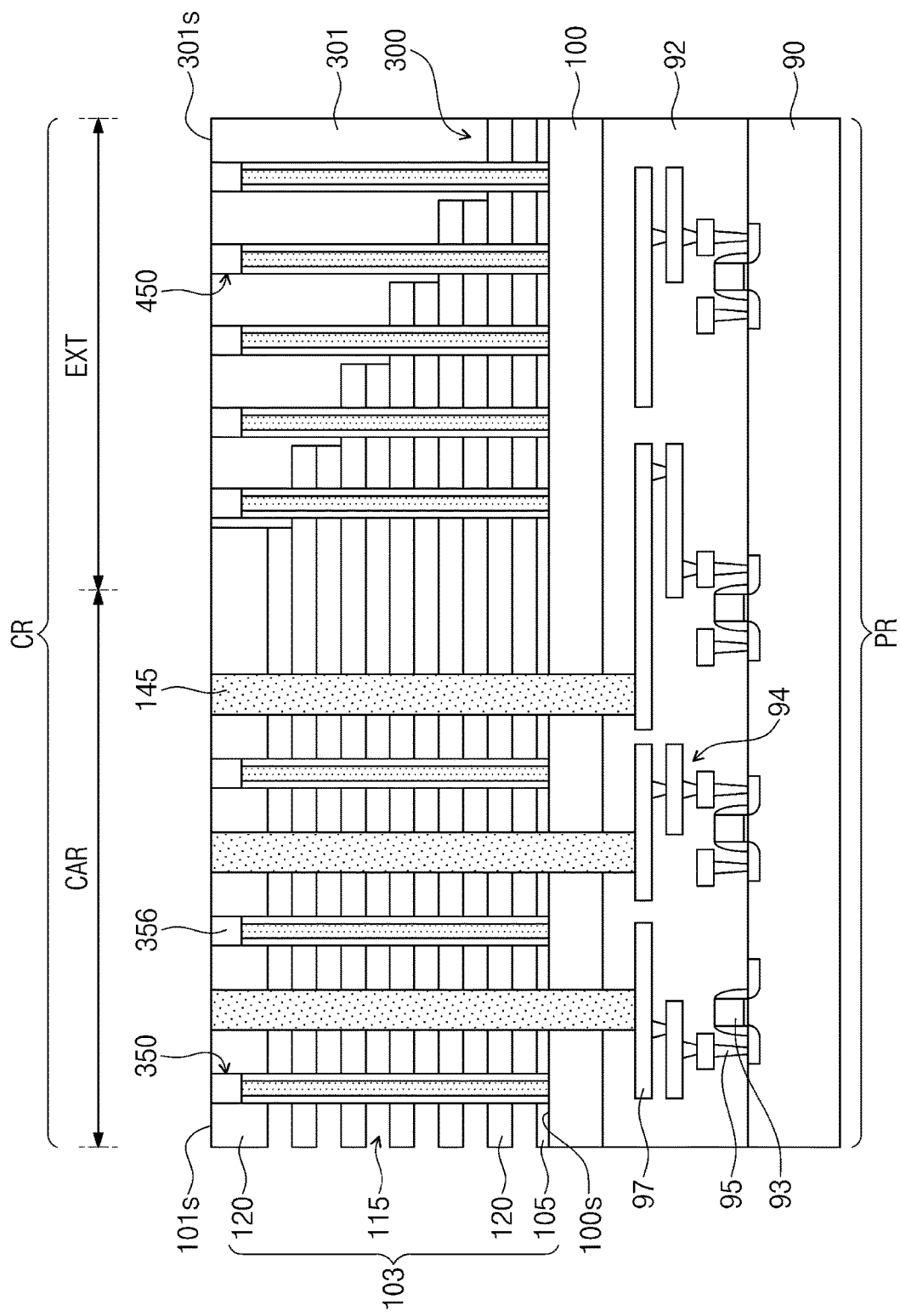

Referring to FIG. 3I, a mold wing 103 may be formed in which spaces 115 are provided between the mold dielectric layers 120. For example, the mold sacrificial layers 110 may be removed by an etching process that uses an etchant capable of selectively etching the mold sacrificial layers 110, which removal may form the spaces 115 between the mold dielectric layers 120. When the mold sacrificial layers 110 include silicon nitride, the mold sacrificial layers 110 may be selectively removed by an etchant that contains, for example, phosphoric acid (H3PO4). The mold dielectric layers 120 may have therebetween cavities or the spaces 115, and accordingly the stepwise structure 300 of the mold wing 103 may have weakness such as sagging or collapse. However, the weakness may be solved because the dummy vertical channels 450 serve to support the stepwise structure 300.

Figure 3J:
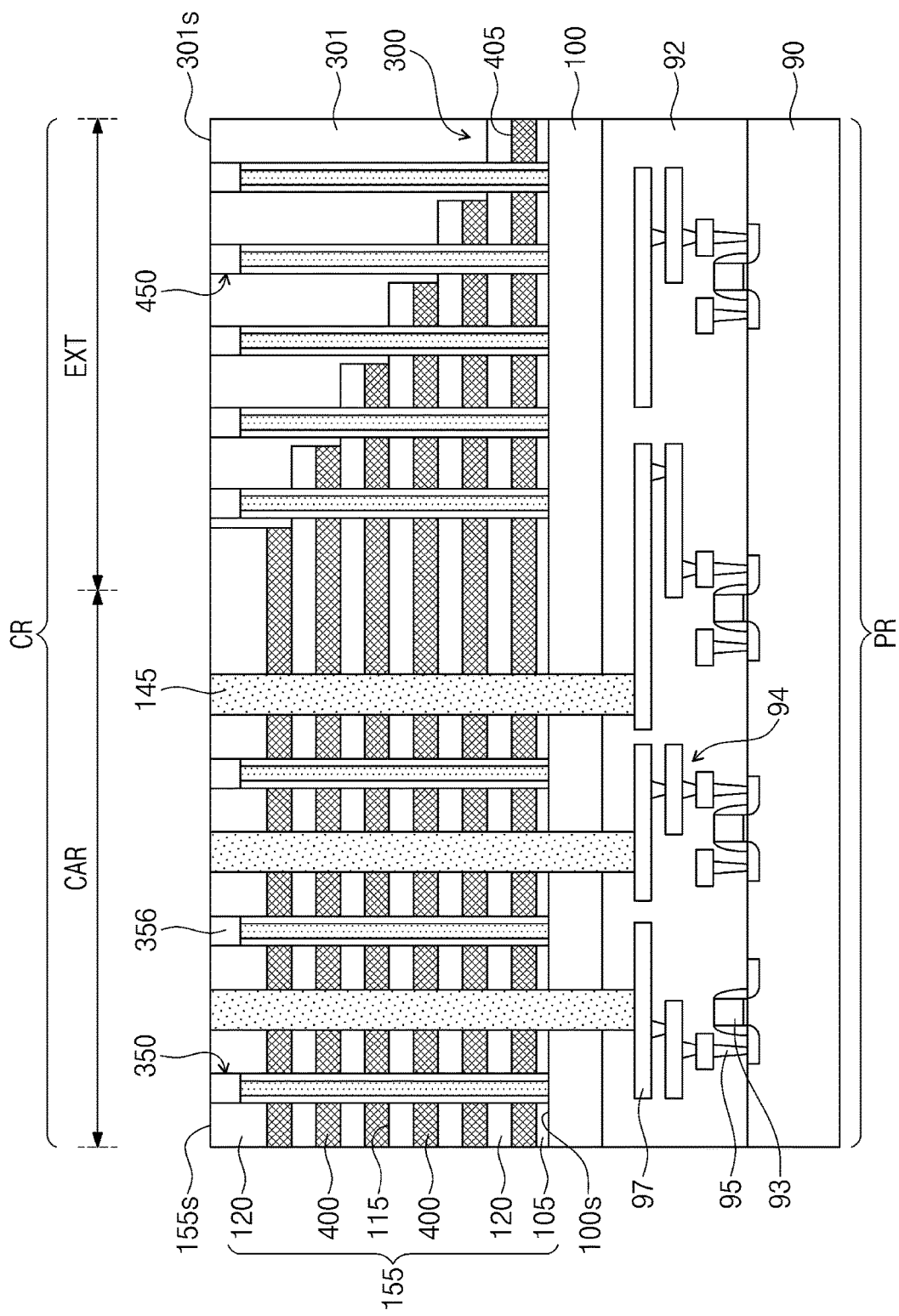

Referring to FIG. 3J, the mold dielectric layers 120 may be provided therebetween with electrodes 400 to form an electrode stack 155 that is on the semiconductor layer 100 and overlaps the peripheral circuit 94 in a direction that is normal to a top surface 100s of the semiconductor layer 100. As further shown in at least FIG. 3J, the electrode stack 155 has the stepwise structure 300. For example, a conductive material may be deposited to form the electrodes 400 filling the spaces 115. The electrodes 400 may include polysilicon or metal. For example, the electrodes 400 may include tungsten. When a process is performed to fill the spaces 115 with the electrodes 400, the dummy vertical channels 450 may support the stepwise structure 300 and as a result the electrode stack 155 may have stable structural stability.

As shown in at least FIG. 3J, the top surface 155s of the electrode stack 155 may be the same as the top surface 101s of the mold 101. Accordingly, as shown in at least FIG. 3J, the first dielectric layer 145a may fill a first portion of the trench 140, the first dielectric layer 145a having a top surface 145as that is proximate to the top surface 155s of the electrode stack 155, the second dielectric layer 145b may fill a second portion of the trench 140, the second dielectric layer 145b having a top surface 145bs that is proximate to the top surface 155s of the electrode stack 155, the top surface of the second dielectric layer being more recessed toward the semiconductor layer 100 than the top surface 145as of the first dielectric layer 145a, and a third dielectric layer 145c may fill a remaining portion of the trench 140 and may cover the top surface 145bs of the second dielectric layer 145b.

The electrodes 400 may constitute a ground select line, word lines, and a string select line. Each of the electrodes 400 may include a pad 405, or an end portion provided on the extension region EXT. The pads 405 at respective end portions of the electrodes 400 may form the stepwise structure 300 on the extension region EXT, and may be supported by the dummy vertical channels 450.

Figure 3K:
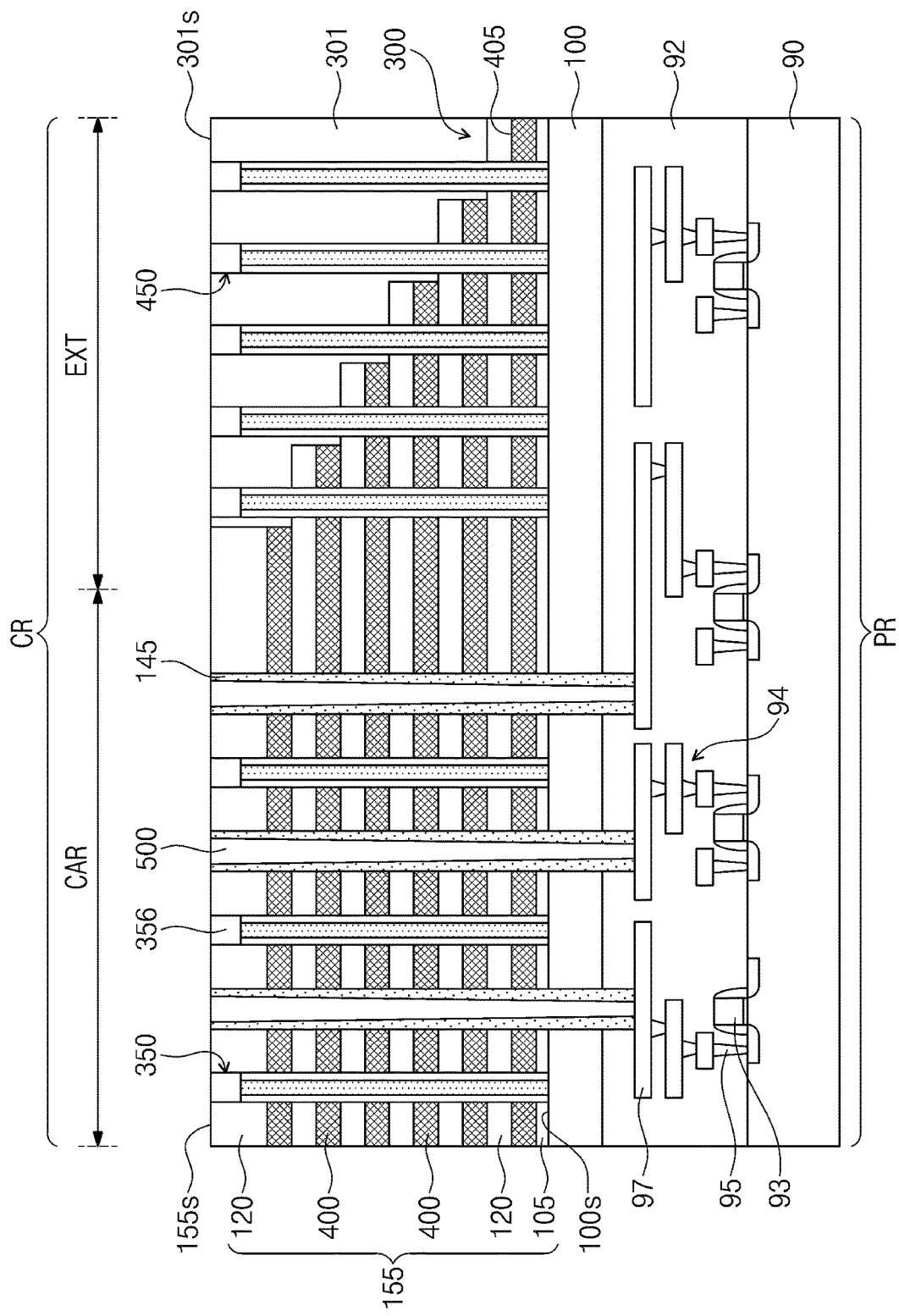

Referring to FIG. 3K, connection plugs 500 may be formed to have connection with the metal lines 97. The connection plugs 500 may have their lengths that penetrate the gap-fill layers 145 and approach the metal lines 97. The gap-fill layers 145 may electrically separate the connection plugs 500 from the electrodes 400. The connection plugs 500 may be electrically connected through the metal lines 97 to the peripheral circuit 94 of the peripheral region PR. For example, as shown in at least FIG. 3K, a first gap-fill layer 145 may surround a first connection plug 500 that sequentially extends through the cell region CR and the peripheral region PR and is coupled to one metal line 97 ("electrical line") of the plurality of metal lines 97. As shown in at least FIG. 3K, a first connection plug 500 may be on the cell array region CAR and may extend through ("penetrate") the electrode stack 155. On the cell array region CAR, one or more of the electrical vertical channels 350 may be disposed between neighboring connection plugs 500. Accordingly, as shown in at least FIG. 3K, each "first" connection plug 500 may be between a separate pair of adjacent electrical vertical channels 350. As shown in at least FIG. 3K, the electrical vertical channels 350 may extend through the electrode stack 155 in the direction that is normal to the top surface 100s of the semiconductor layer 100 and are electrically connected to the semiconductor layer 100.

Figure 3L:
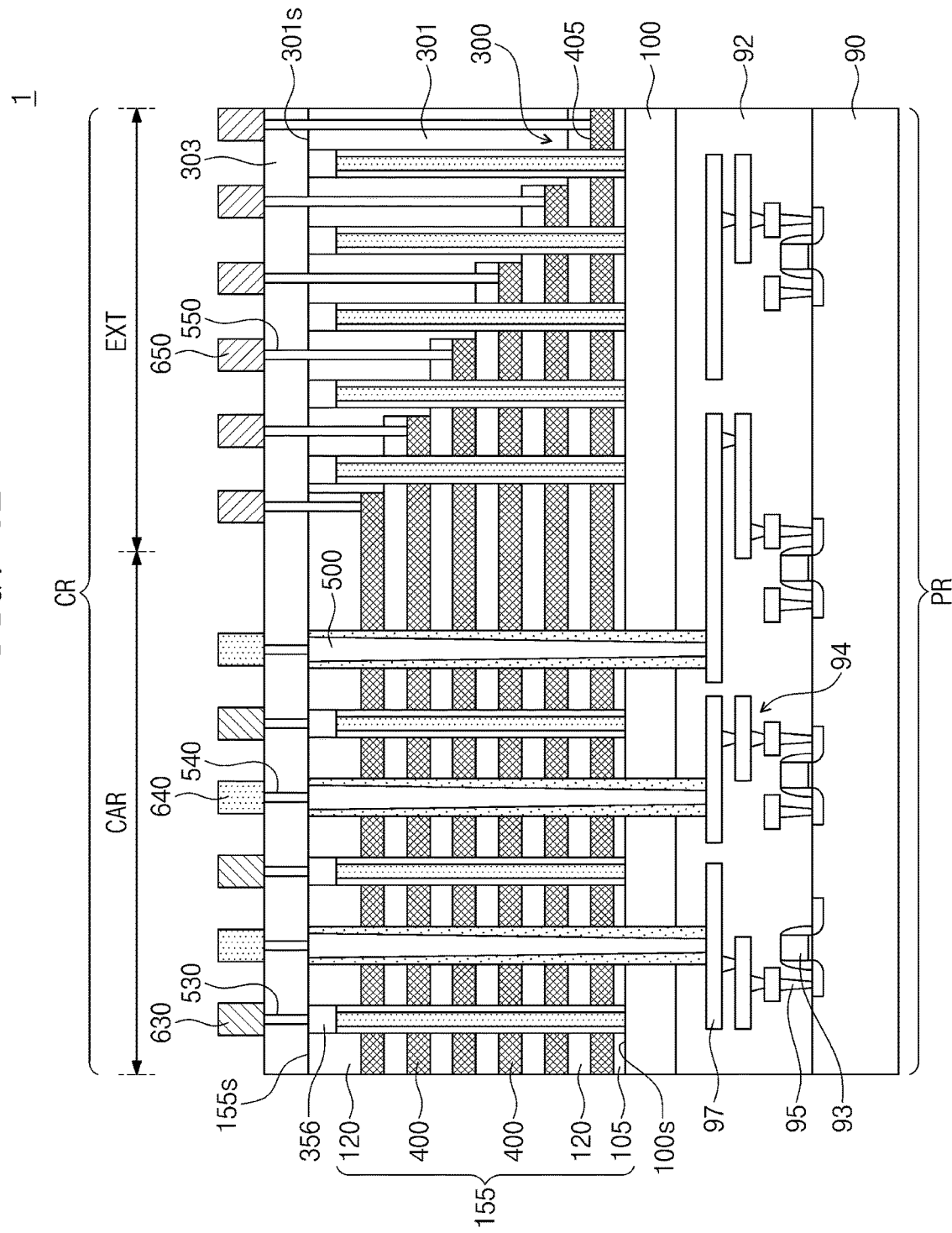

Referring to FIG. 3L, bit lines 630 and connection lines 640 may be formed on the cell array region CAR, and metal lines 650 may be formed on the extension region EXT. For example, a dielectric material may be deposited to form an interlayer dielectric layer 303 covering the electrode stack 155 and the planarized dielectric layer 301. On the cell array region CAR, bit line contacts 530 may be formed to penetrate the interlayer dielectric layer 303 and to have coupling with the pads 356 of the electrical vertical channels 350, and connection contacts 540 may be formed to have coupling with the connection plugs 500. On the extension region EXT, metal contacts 550 may be formed to penetrate the interlayer dielectric layer 303 and the planarized dielectric layer 301 and to have coupling with the pads 405 of the electrodes 400. The metal contacts 550 may further penetrate the mold dielectric layers 120 on the pads 405 of the electrodes 400. Accordingly, the metal contacts 550 may be coupled to separate, respective pads 405 of the electrodes 400.

A conductive material may be deposited and patterned to form the bit lines 630, the connection lines 640, and the metal lines 650 on the interlayer dielectric layer 303. The bit lines 630 may be electrically connected through the bit line contacts 530 to the electrical vertical channels 350. The connection lines 640 (also referred to herein as "first connection lines") may be electrically connected through the connection contacts 540 to respective connection plugs 500. The metal lines 650 may be electrically connected through separate, respective metal contacts 550 to separate, respective pads 405 of the electrodes 400.

Through the processes mentioned above, a semiconductor device 1 may be manufactured. The semiconductor device 1 may be a three-dimensional vertical NAND Flash memory device having a cell-on-peripheral structure in which the cell region CR is stacked on the peripheral region PR.

While at least FIG. 3L illustrates example embodiments of a semiconductor device that include multiple "first" connection plugs 500, it will be understood that in some example embodiments the semiconductor device may include only a single, individual first connection plug 500.

Figure 4A:
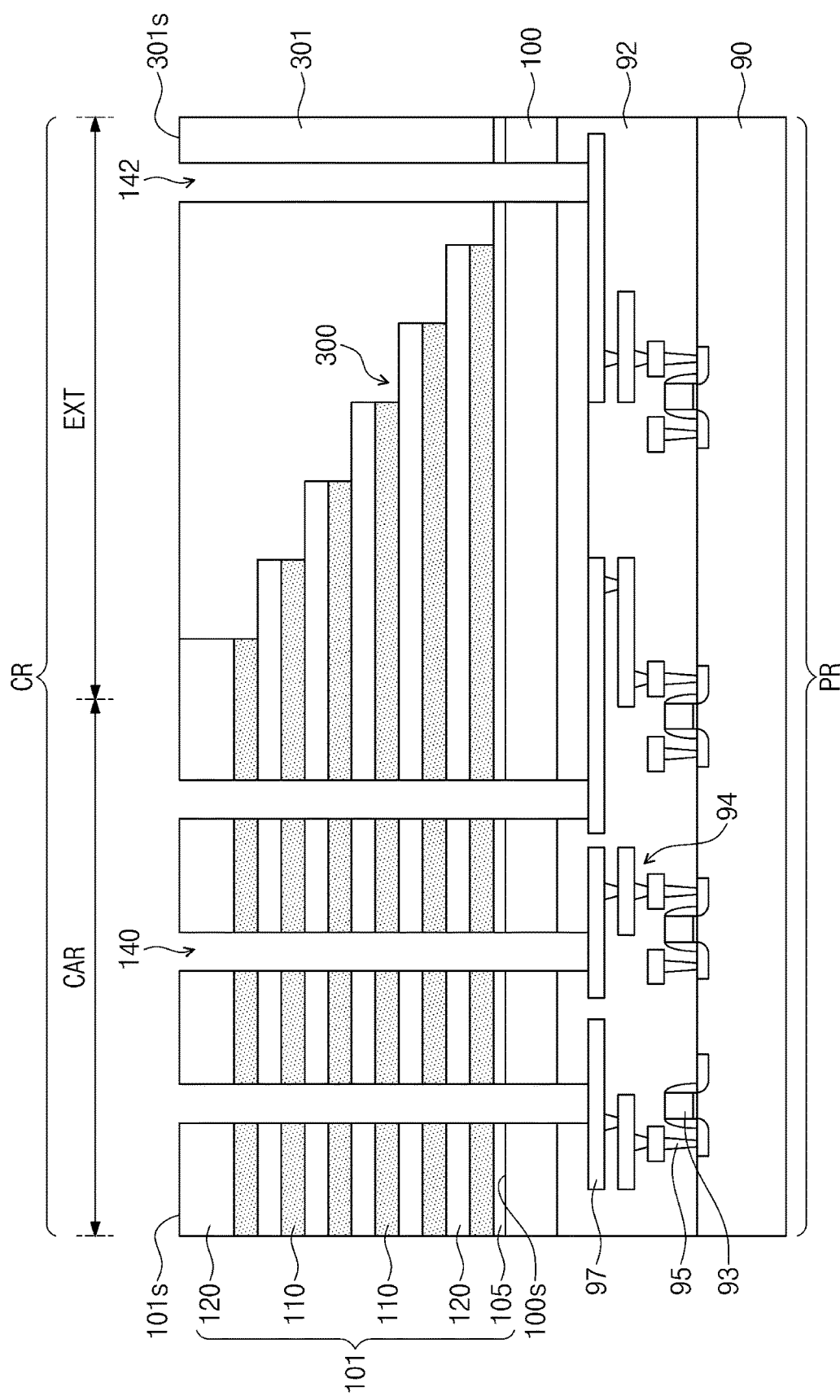
Figure 4B:
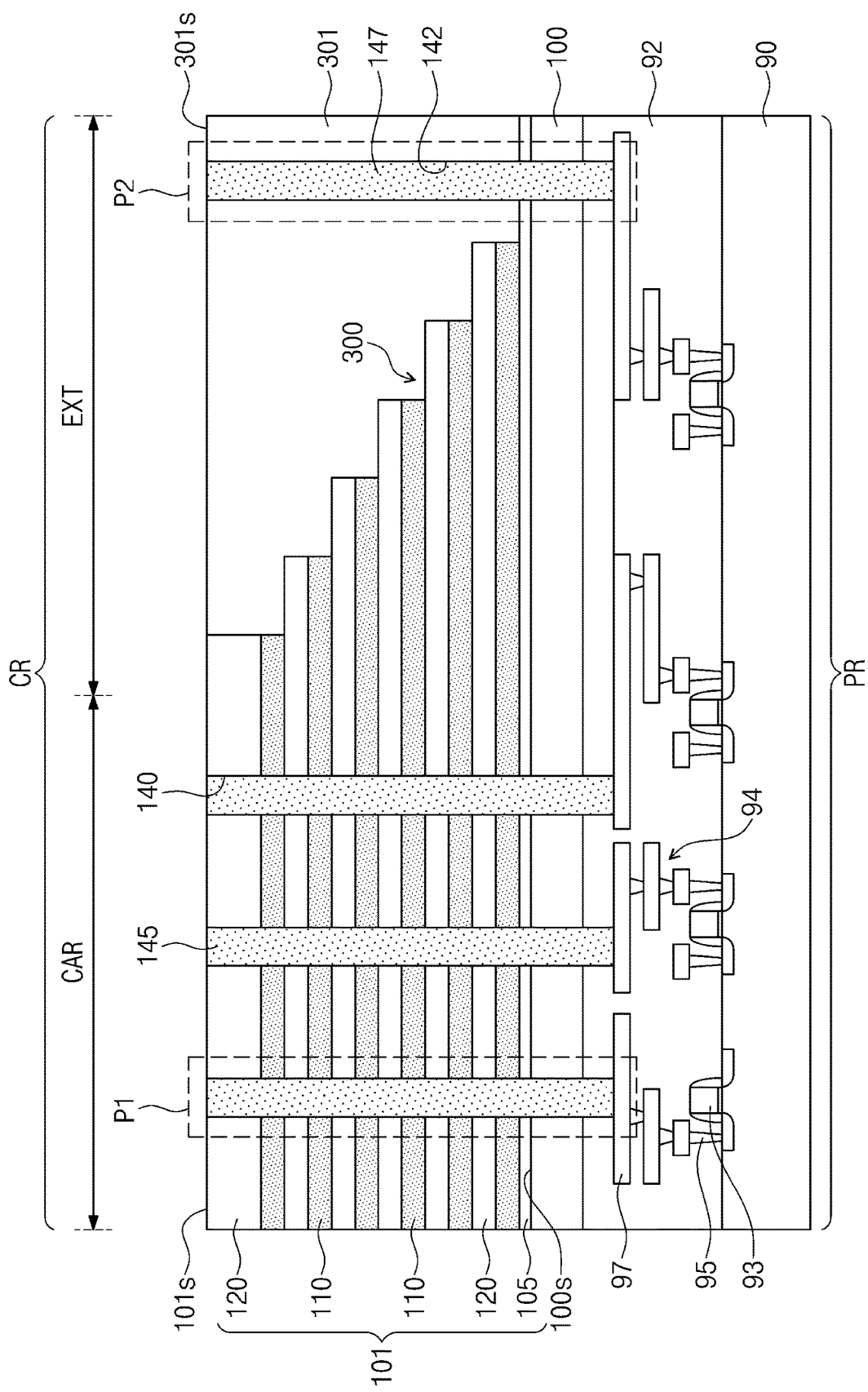
Figure 4C:
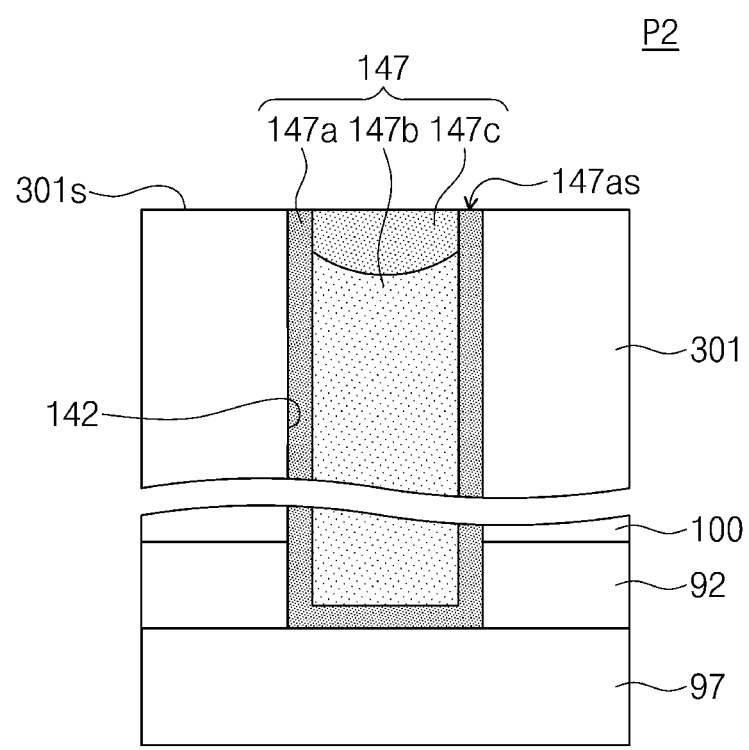
Figure 4D:
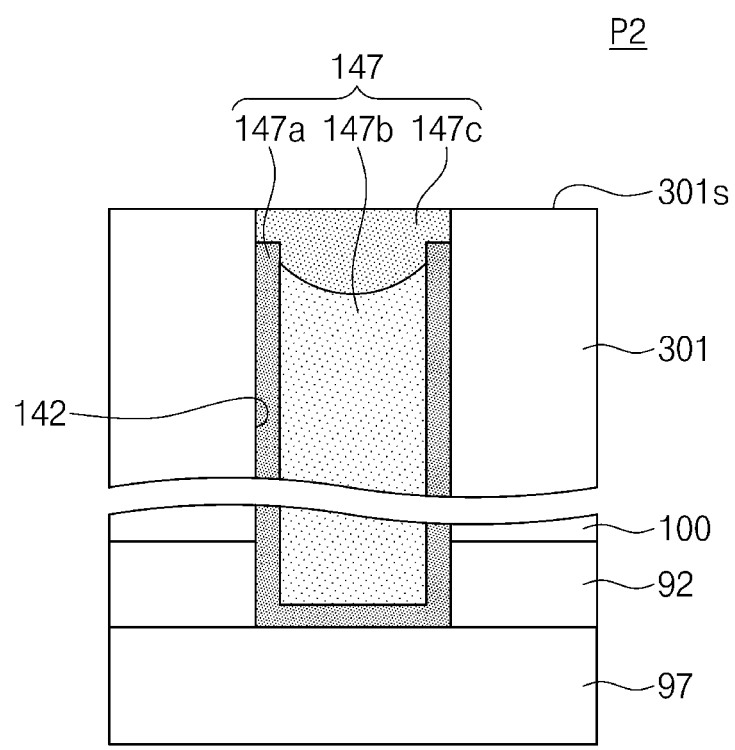

FIGS. 4A, 4B, 4C, 4D, 4E, and 4F illustrate cross-sectional views showing a method of manufacturing a semiconductor device according to some example embodiments of the present inventive concepts. FIGS. 4C and 4D illustrate enlarged cross-sectional views showing section P2 of FIG. 4B.

Referring to FIG. 4A, processes identical or similar to those discussed above with reference to FIGS. 3A to 3C may be performed to form the semiconductor layer 100 on the peripheral region PR and to form the mold 101 having the stepwise structure 300 on the semiconductor layer 100. The planarized dielectric layer 301 covering the stepwise structure 300 may be formed on the semiconductor layer 100, one or more trenches 140 may be formed on the cell array region CAR, and an additional trench 142 may be formed on the extension region EXT. The additional trench 142 may be provided in plural. The additional trench 142 may have a depth that penetrates the planarized dielectric layer 301, the semiconductor layer 100, and the lower dielectric layer 92 and approaches an uppermost metal line 97 of the peripheral region PR. The additional trench 142 may be formed simultaneously with the trenches 140.

Referring to FIG. 4B, the gap-fill layers 145 may be formed to fill the trenches 140, and an additional gap-fill layer 147 (also referred to herein as a "second gap-fill layer") may be formed to fill the additional trench 142. The gap-fill layers 145 (also referred to herein as "first gap-fill layers") may be provided on the cell array region CAR, and the additional gap-fill layer 147 may be provided on the extension region EXT. The gap-fill layers 145 and the additional ("second") gap-fill layer 147 may be formed by the gap-fill layer formation method discussed above with reference to FIGS. 1A to 1I or 2A to 2D. The description of FIGS. 1A to 1I or 2A to 2D may be incorporated into that of FIG. 4B.

Each of the gap-fill layers 145 may have the shape illustrated in FIG. 3E or 3F. The additional gap-fill layer 147 may include, as shown in FIG. 4C, first, second, and third dielectric layers 147a, 147b, and 147c provided in the additional trench 142 (also referred to herein as a "second trench" in relation to trench 140) that penetrates the planarized dielectric layer 301, the semiconductor layer 100, and the lower dielectric layer 92 and reveals the metal line 97. The first, second, and third dielectric layers 147a, 147b, and 147c may respectively correspond to the first, second, and third dielectric layers 14, 15, and 16 of FIG. 1I. In some example embodiments, the first, second, and third dielectric layers 147a, 147b, and 147c may be referred to herein as fourth, fifth, and sixth dielectric layers, respectively, with regard to the first, second, and third dielectric layers 145a, 145b, and 145c. Accordingly, in some example embodiments, an additional gap-fill layer 147 may include a fourth dielectric layer 147a filling a first portion of a second trench 142, the second trench 142 having a depth that extends through the cell region CR and the peripheral region PR and approaches a separate metal line 97, the fourth dielectric layer 147a having a top surface that is proximate to a top surface 301s of a dielectric layer 301, a fifth dielectric layer 147b filling a second portion of the second trench 142, the fifth dielectric 147b layer having a top surface that is proximate to the top surface 301s of the dielectric layer 301, the top surface of the fifth dielectric layer 147b being more recessed toward the semiconductor layer 100 than the top surface of the fourth dielectric layer; and a sixth dielectric layer 147c filling a remaining portion of the second trench 142 and covering the top surface of the fifth dielectric layer 147b.

The additional gap-fill layer 147 may have a shape in which the second and third dielectric layers 147b and 147c are sequentially stacked within the first dielectric layer 147a shaped like a pipe or U (see also FIG. 1I). A top surface 147as of the first dielectric layer 147a may be exposed. Alternatively, as shown in FIG. 4D, the additional gap-fill layer 147 may have a shape in which the third dielectric layer 147c covers the pipe- or U-shaped first dielectric layer 147a surrounding the second dielectric layer 147b (see also FIG. 2D).

Referring to FIG. 4E, processes identical or similar to those discussed above with reference to FIGS. 3G to 3K may be performed to replace the mold dielectric layers 120 with the electrodes 400 to form the electrode stack 155. The electrical vertical channels 350 and the connection plugs 500 may be formed on the cell array region CAR, and the dummy vertical channels 450 and an additional connection plug 502 may be formed on the extension region EXT.

The electrical vertical channels 350 may penetrate the electrode stack 155 and have electrical connection with the semiconductor layer 100, and the connection plugs 500 may penetrate the gap-fill layers 145 and have electrical connection with the metal lines 97 of the peripheral region PR. The dummy vertical channels 450 may penetrate the stepwise structure 300 of the electrode stack 155 and have no electrical connection with the semiconductor layer 100. The additional connection plug 502 may penetrate the additional gap-fill layer 147 and have electrical connection with the metal line 97 of the peripheral region PR.

Figure 4F:
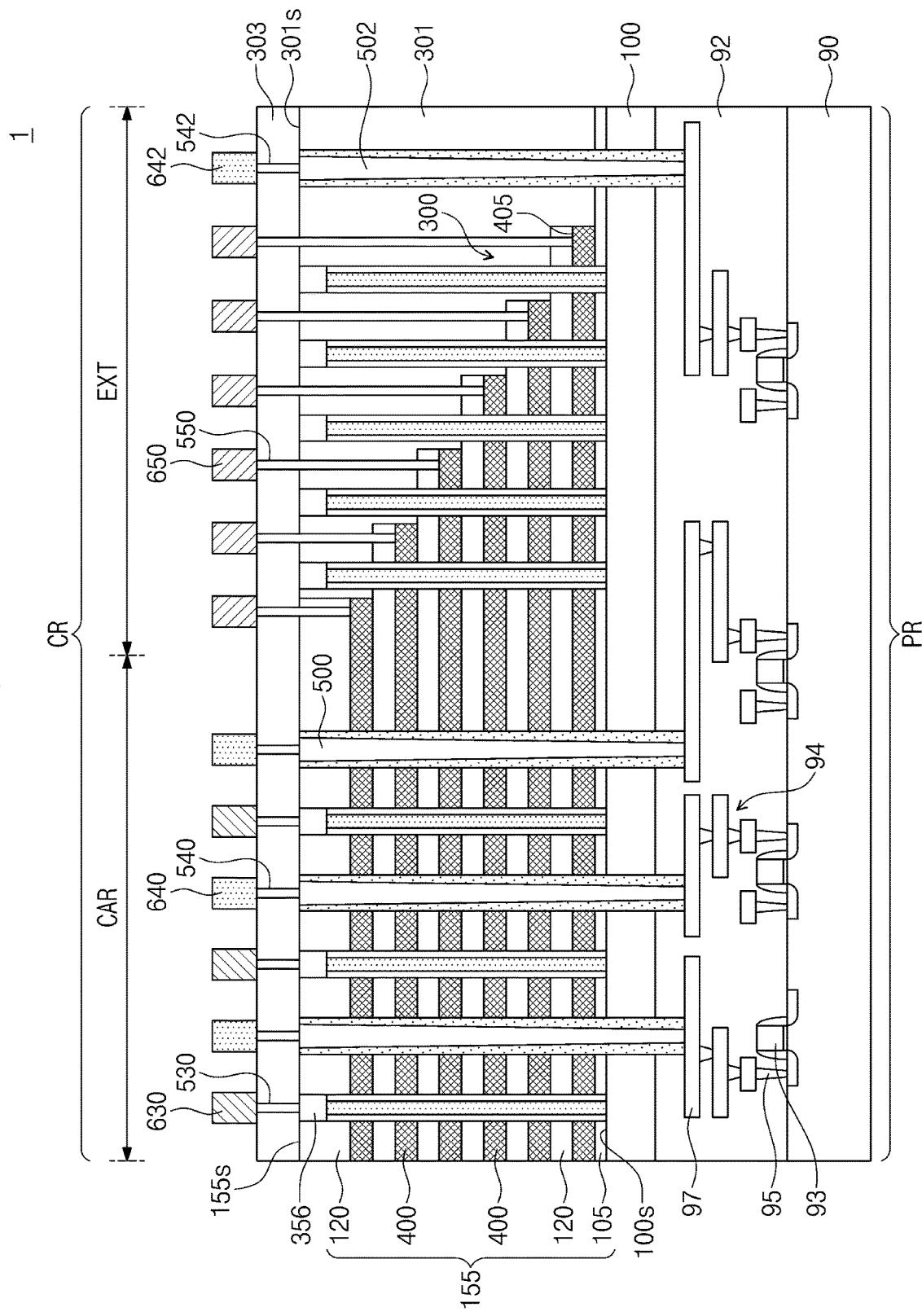

Referring to FIG. 4F, processes identical or similar to those discussed above with reference to FIG. 3L may be performed to form the bit lines 630 electrically connected to the electrical vertical channels 350, to form the connection lines 640 electrically connected to the connection plugs 500, and to form an additional connection line 642 electrically connected to the additional connection plug 502. Through the processes discussed above, the semiconductor device 1 may further include the additional connection plug 502 (also referred to herein as a "second connection plug") in addition to the connection plugs 500 (also referred to herein as "first connection plugs"). For example, as shown in at least FIG. 4F, second gap-fill layer 147 may surround a second connection plug 502 that sequentially extends through the cell region CR and the peripheral region PR and is coupled to a separate metal line 97 ("electrical line") of the plurality of metal lines 97, relative to the one metal line 97 described with regard to the first gap-fill layer 145 and first connection plug 500 as shown in at least FIG. 3K. As shown in at least FIG. 4F, a second connection plug 500 may be on the extension region EXT.

According to the present inventive concepts, different kinds of dielectric layers may be deposited in a trench, and an etching process may be performed to recess the dielectric layers, with the result that the dielectric layers may not have therebetween interfaces that serve as crack sources. In conclusion, it may be possible to obtain a gap-fill layer without the occurrence of cracks.

The advantages compared to the present inventive concepts and the prior art will be apparent through the appended claims and the specification discussed with reference to the accompanying drawings. The present inventive concepts are distinctly claimed and particularly pointed out in the claims. However, the present inventive concepts may best be understood by reference to the specification in conjunction with the accompanying drawings. In the specification, like reference numerals refer to like components throughout the accompanying drawings.

This detailed description of the present inventive concepts should not be construed as limited to the example embodiments set forth herein, and it is intended that the present inventive concepts cover the various combinations, the modifications and variations of the inventive concepts without departing from the spirit and scope of the present inventive concepts. The appended claims should be construed to include other example embodiments.

What is claimed is:
1. A device, comprising:
a lower layer;
an upper layer on a top surface of the lower layer, the upper layer defining a trench extending from a top surface of the upper layer towards the lower layer, the trench exposing the lower layer, such that the trench extends from the top surface of the upper layer to a bottom surface of the upper layer, wherein
the top surface of the lower layer is coplanar with the bottom surface of the upper layer, and
the trench stops at the top surface of the lower layer such that a bottom of the trench is coplanar with the bottom surface of the upper layer; and
a gap-fill layer filling the trench on the lower layer, the gap-fill layer having a multi-layered structure, the gap-fill layer including
a first dielectric layer that fills a first portion of the trench, the first dielectric layer having a top surface that is proximate to the top surface of the upper layer, the first portion of the trench including at least the bottom of the trench such that the first dielectric layer has a bottom surface that is coplanar with both the bottom surface of the upper layer and the top surface of the lower layer;
a second dielectric layer that fills a second portion of the trench, the second dielectric layer having a top surface that is proximate to the top surface of the upper layer, the top surface of the second dielectric layer is more recessed toward the lower layer than the top surface of the first dielectric layer; and
a third dielectric layer that fills a remaining portion of the trench and covers the top surface of the second dielectric layer,
wherein the first dielectric layer has a U shape such that the first portion of the trench is an outer and lower portion of the trench and the second portion of the trench is a central portion of the trench,
wherein the first dielectric layer has the U shape such that the first dielectric layer includes two top ends on an inner sidewall surface of the trench, the two top ends of the first dielectric layer proximate to the top surface of the upper layer,
wherein the third dielectric layer is in direct contact with both the first dielectric layer and the second dielectric layer,
wherein the first dielectric layer has a density greater than a density of the second dielectric layer,
wherein the second and third dielectric layers have a same material composition.

2. The device of claim 1, wherein each top end of the two top ends of the first dielectric layer is exposed at the top surface of the upper layer.

3. The device of claim 1, wherein a top surface of each top end of the two top ends of the first dielectric layer is at a level that is than a level of the top surface of the upper layer over the top surface of the lower layer.

4. The device of claim 1, wherein the third dielectric layer further covers the two top ends of the first dielectric layer.

5. The device of claim 1, wherein an interface between the second and third dielectric layers has a concave shape toward the lower layer.

6. The device of claim 1, wherein
the upper layer includes a plurality of stacked layers, and
the plurality of stacked layers includes a dielectric layer, a conductive layer, or a combination thereof.

7. The device of claim 1, wherein
the first dielectric layer has the U shape such that the first dielectric layer defines an open enclosure that is open towards the top surface of the upper layer,
the second dielectric layer fills a portion of the open enclosure of the first dielectric layer, and
the third dielectric layer fills a remaining portion of the open enclosure of the first dielectric layer.

8. A semiconductor device, comprising:
a peripheral region including a peripheral circuit, the peripheral circuit including
a plurality of transistors on a substrate, and
a plurality of electrical lines electrically connected to the plurality of transistors;
a cell region on the peripheral region, the cell region including
a semiconductor layer on the peripheral region,
an electrode stack on the semiconductor layer and overlapping the peripheral circuit in a direction that is normal to a top surface of the semiconductor layer, the electrode stack having a stepwise structure, and
a plurality of electrical vertical channels extending through the electrode stack in the direction that is normal to the top surface of the semiconductor layer, the plurality of electrical vertical channels electrically connected to the semiconductor layer; and
a first gap-fill layer surrounding a first connection plug that sequentially extends through the cell region and the peripheral region and is coupled to one electrical line of the plurality of electrical lines,
wherein the first gap-fill layer includes
a first dielectric layer filling a first portion of a first trench, the first trench having a depth that extends through the cell region and the peripheral region and stops at a top surface of the one electrical line, the first dielectric layer having a top surface that is proximate to a top surface of the electrode stack,
a second dielectric layer filling a second portion of the first trench, the second dielectric layer having a top surface that is proximate to the top surface of the electrode stack, the top surface of the second dielectric layer being more recessed toward the semiconductor layer than the top surface of the first dielectric layer, and
a third dielectric layer filling a remaining portion of the first trench and covering the top surface of the second dielectric layer,
wherein the first dielectric layer has a U shape that defines an open enclosure that is open towards the top surface of the electrode stack,
wherein the first dielectric layer has the U shape such that the first dielectric layer includes two top ends on an inner sidewall surface of the first trench, the two top ends are more distal to the top surface of the semiconductor layer in relation to the second dielectric layer and are isolated from direct contact with each other,
wherein the third dielectric layer is in direct contact with both the first dielectric layer and the second dielectric layer,
wherein the first dielectric layer has a density greater than a density of the second dielectric layer,
wherein the second and third dielectric layers have a same material composition.

9. The semiconductor device of claim 8, wherein
the second dielectric layer fills a portion of the open enclosure of the first dielectric layer, and
the third dielectric layer is between the two top ends of the first dielectric layer.

10. The semiconductor device of claim 8, wherein
the second dielectric layer fills a portion of the open enclosure of the first dielectric layer, and
the third dielectric layer is between and covers the two top ends of the first dielectric layer.

11. The semiconductor device of claim 8, wherein
the cell region is divided into a cell array region and an extension region,
the electrical vertical channels are on the cell array region,
the stepwise structure is on the extension region, and
the first connection plug is on the cell array region of the cell region and extends through the electrode stack.

12. The semiconductor device of claim 11, further comprising:
a second gap-fill layer surrounding a second connection plug that sequentially extends through the cell region and the peripheral region and is coupled to a separate electrical line of the plurality of electrical lines,
wherein the second connection plug is on the extension region of the cell region.

13. The semiconductor device of claim 12, wherein
the second gap-fill layer includes a fourth dielectric layer filling a first portion of a second trench, the second trench having a depth that extends through the cell region and the peripheral region and stops at a top surface of the separate electrical line, the fourth dielectric layer having a top surface that is proximate to a top surface of a dielectric layer;
a fifth dielectric layer filling a second portion of the second trench, the fifth dielectric layer having a top surface that is proximate to the top surface of the dielectric layer, the top surface of the fifth dielectric layer being more recessed toward the semiconductor layer than the top surface of the fourth dielectric layer; and
a sixth dielectric layer filling a remaining portion of the second trench and covering the top surface of the fifth dielectric layer.

14. The semiconductor device of claim 8, wherein
the electrode stack includes a plurality of electrodes that are stacked on the semiconductor layer and have pads at respective end portions of the electrodes, and
the cell region further includes
a first connection line electrically connected to the first connection plug,
a plurality of dummy vertical channels extending through the stepwise structure,
a plurality of metal contacts coupled to separate, respective pads of the plurality of electrodes, and
a plurality of metal lines electrically connected to separate, respective metal contacts.

15. A device, comprising:
a lower layer;
an upper layer on a top surface of the lower layer, the upper layer defining a trench extending from a top surface of the upper layer towards the lower layer, the trench exposing the lower layer, such that the trench extends from the top surface of the upper layer to a bottom surface of the upper layer, wherein
the top surface of the lower layer is coplanar with the bottom surface of the upper layer, and
the trench stops at the top surface of the lower layer such that a bottom of the trench is coplanar with the bottom surface of the upper layer; and
a gap-fill layer filling the trench, the gap-fill layer having a multi-layered structure, the gap-fill layer including
a first dielectric layer that fills a first portion of the trench, the first dielectric layer having a top surface that is proximate to the top surface of the upper layer, the first portion of the trench including at least the bottom of the trench such that the first dielectric layer has a bottom surface that is coplanar with the bottom surface of the upper layer and the top surface of the lower layer,
a second dielectric layer that fills a second portion of the trench, the second dielectric layer having a top surface that is proximate to the top surface of the upper layer, the top surface of the second dielectric layer is more recessed toward the lower layer than the top surface of the first dielectric layer, and
a third dielectric layer that fills a remaining portion of the trench and covers the top surface of the second dielectric layer,
wherein the third dielectric layer has an increased thickness as a distance from inner walls of the trench increases,
wherein a top surface of the third dielectric layer is located at a same level as the top surface of the upper layer,
wherein the top surface of the third dielectric layer is located at a same level as the top surface of the first dielectric layer,
wherein the first dielectric layer has a density greater than a density of the second dielectric layer,
wherein the second and third dielectric layers have a same material composition.

16. The device of claim 15, wherein the top surface of the first dielectric layer, the top surface of the third dielectric layer, and the top surface of the upper layer are coplanar.

* * * * *